(12) United States Patent
Kim et al.

(10) Patent No.: US 12,446,420 B2
(45) Date of Patent: Oct. 14, 2025

(54) DISPLAY DEVICE AND METHOD OF MANUFACTURING THE SAME

(71) Applicant: Samsung Display Co., Ltd., Yongin-Si (KR)

(72) Inventors: Youngrok Kim, Yongin-si (KR); Kyu-Soon Park, Yongin-si (KR); Jong-Hyun Choung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 430 days.

(21) Appl. No.: 18/123,987

(22) Filed: Mar. 21, 2023

(65) Prior Publication Data

US 2024/0057409 A1 Feb. 15, 2024

(30) Foreign Application Priority Data

Aug. 10, 2022 (KR) ........................ 10-2022-0099640

(51) Int. Cl.
| | |
|---|---|
| H10K 59/131 | (2023.01) |
| H10K 59/12 | (2023.01) |
| H10K 59/123 | (2023.01) |
| H10K 59/88 | (2023.01) |
| H10K 71/00 | (2023.01) |

(52) U.S. Cl.
CPC ....... *H10K 59/131* (2023.02); *H10K 59/1201* (2023.02); *H10K 59/123* (2023.02); *H10K 59/88* (2023.02); *H10K 71/00* (2023.02)

(58) Field of Classification Search
None
See application file for complete search history.

(56) References Cited

U.S. PATENT DOCUMENTS

| | | | |
|---|---|---|---|
| 10,153,446 B2 | 12/2018 | Maruyama | |
| 10,345,942 B2 | 7/2019 | Cho et al. | |
| 2006/0269786 A1* | 11/2006 | Shin | H10D 86/441 |
| | | | 428/690 |
| 2015/0171154 A1* | 6/2015 | Kang | H10K 59/122 |
| | | | 438/151 |
| 2015/0221681 A1* | 8/2015 | Guo | H10D 30/6729 |
| | | | 438/151 |

(Continued)

FOREIGN PATENT DOCUMENTS

| | | | | | |
|---|---|---|---|---|---|
| CN | 113130593 A | * | 7/2021 | ........... | H10K 59/131 |
| CN | 119730617 A | * | 3/2025 | ........... | H10K 59/122 |

(Continued)

*Primary Examiner* — Michael Lebentritt
(74) *Attorney, Agent, or Firm* — Innovation Counsel LLP

(57) ABSTRACT

A display device is disclosed that includes a substrate, a thin film transistor, a power line, a pixel electrode, an emission layer, a common electrode, and dummy electrodes. The thin film transistor is disposed on the substrate. The power line is disposed on the substrate and includes a first conductive layer and a second conductive layer having a protrusion part spaced apart from an upper surface of a first conductive layer. The pixel electrode is disposed on the substrate and is electrically connected to a thin film transistor. The emission layer is disposed on the pixel electrode. The common electrode is disposed on the emission layer and contacts the power line. The dummy electrodes are disposed on the same layer as the power line and include the same material as the pixel electrode.

20 Claims, 26 Drawing Sheets

(56) References Cited

U.S. PATENT DOCUMENTS

| | | | |
|---|---|---|---|
| 2021/0202655 A1 | 7/2021 | Cho et al. | |
| 2022/0102471 A1* | 3/2022 | Jang et al. | |
| 2024/0196697 A1* | 6/2024 | Kim | H10K 59/124 |
| 2024/0324303 A1* | 9/2024 | Jung | H10K 59/131 |

FOREIGN PATENT DOCUMENTS

| | | | | |
|---|---|---|---|---|
| KR | 20080100997 A | * | 11/2008 | ....... G02F 1/134363 |
| KR | 10-2017-0063326 A | | 6/2017 | |
| KR | 10-2021-0086869 A | | 7/2021 | |
| KR | 10-2022-0042815 A | | 4/2022 | |
| KR | 20230094650 A | * | 6/2023 | ....... H10K 59/80522 |
| KR | 20230100570 A | * | 7/2023 | ............. H10K 50/81 |
| KR | 20230101156 A | * | 7/2023 | ............. H10K 59/35 |
| KR | 20240044553 A | * | 4/2024 | ............. H10K 71/00 |
| KR | 20240056884 A | * | 5/2024 | ......... H10D 86/0221 |

* cited by examiner

DISPLAY DEVICE AND METHOD OF MANUFACTURING THE SAME

This application claims priority to Korean Patent Application No. 10-2022-0099640, filed on Aug. 10, 2022, and all the benefits accruing therefrom under 35 U.S.C. § 119, the content of which in its entirety is herein incorporated by reference.

BACKGROUND

1. Field

Embodiments of the invention relate to a display device and a method of manufacturing the display device.

2. Description of the Related Art

A display device includes light emitting device, and the light emitting devices include a common electrode formed of a plate electrode. As the size of the display device increases, display quality of the display device may deteriorate due to a drop in voltage provided to the common electrode. Accordingly, it would be desirable to have a structure for preventing a drop in voltage provided to the common electrode.

SUMMARY

Embodiments provide a display device.

Embodiments provide a method of manufacturing the display device

A display device according to an embodiment may include a substrate, a thin film transistor disposed on the substrate, a power line disposed on the substrate and including a first conductive layer and a second conductive layer having a protrusion part spaced apart from an upper surface of the first conductive layer, a pixel electrode disposed on the substrate and electrically connected to the thin film transistor, an emission layer disposed on the pixel electrode, a common electrode disposed on the emission layer and contacting the power line, and dummy electrodes disposed on the same layer as the power line and including the same material as the pixel electrode.

In an embodiment, a side surface of the first conductive layer may have a step.

In an embodiment, the first conductive layer may include a first tapered part having a tapered shape and having an upper surface of a first width and a second tapered part positioned on the first tapered part, having a tapered shape, and having a lower surface of a second width smaller than the first width.

In an embodiment, the power line may have a depression part defined by the upper surface of the first tapered part, a side surface of the second tapered part, and a lower surface of the protrusion part of the second conductive layer, and the common electrode may contact the side surface of the first conductive layer in the depression part.

In an embodiment, a side surface of the first conductive layer may have a curved shape.

In an embodiment, the power line may have a depression part defined by the side surface of the first conductive layer and a lower surface of the protrusion part of the second conductive layer, and the common electrode may contact the side surface of the first conductive layer in the depression part.

In an embodiment, a width of a lower surface of the protrusion part may be about 0.1 micrometers to about 1.0 micrometers.

In an embodiment, each of the dummy electrodes may contact the power line.

In an embodiment, the display device may further include a first cover part disposed on the second conductive layer and including the same material as the pixel electrode and the dummy electrodes, a second cover part disposed on the first cover part and including the same material as the emission layer, and a third cover part disposed on the second cover part and including the same material as the common electrode.

In an embodiment, the emission layer may contact the power line.

In an embodiment, the display device may further include a third conductive layer disposed below the first conductive layer.

A method of manufacturing a display device according to embodiment may include forming a power line including a first conductive layer and a second conductive layer disposed on the first conductive layer and a thin film transistor on a substrate, forming a plurality of insulating layers defining an opening exposing the power line on the substrate, forming a first preliminary layer covering the plurality of insulating layers and the power line, forming a first photoresist pattern exposing a portion of the first preliminary layer by coating a photoresist film on the first preliminary layer and exposing the photoresist film using an exposure mask, removing the portion of the first preliminary layer exposed by the first photoresist pattern to form a pixel electrode electrically connected to the thin film transistor and a second preliminary layer covering the power line, ashing the first photoresist pattern to form a second photoresist pattern exposing a portion of the second preliminary layer, removing the portion of the second preliminary layer exposed by the second photoresist pattern to form dummy electrodes disposed on the same layer as the power line and including the same material as the pixel electrode and expose a portion of the power line, removing the second photoresist pattern, forming an emission layer disposed on the pixel electrode, forming a common electrode disposed on the emission layer and contacting the power line.

In an embodiment, the exposure mask may include a light blocking part which blocks light, a first light transmitting part having a first light transmittance, and a second light transmitting part having a second light transmittance lower than the first light transmittance.

In an embodiment, the portion of the second preliminary layer exposed by the second photoresist pattern may be removed by an etching process using an etchant, and an etching rate of the second conductive layer with using the etchant may be lower than an etching rate of the first conductive layer using the etchant.

In an embodiment, in the step of removing the portion of the second preliminary layer exposed by the second photoresist pattern, a portion of the first conductive layer may be removed together with the portion of the second preliminary layer.

In an embodiment, after removing the portion of the second preliminary layer exposed by the second photoresist pattern, a side surface of the first conductive layer may have a step.

In an embodiment, after removing the portion of the second preliminary layer exposed by the second photoresist pattern, the first conductive layer may include a first tapered part having a tapered shape and having an upper surface of a first width and a second tapered part positioned on the first tapered part, having a tapered shape, and having a lower surface of a second width smaller than the first width.

In an embodiment, after removing the portion of the second preliminary layer exposed by the second photoresist pattern, a side surface of the first conductive layer may have a curved shape.

In an embodiment, in the step of removing the portion of the second preliminary layer exposed by the second photoresist pattern, a first cover part including the same material as the dummy electrodes may be formed on the second conductive layer.

In an embodiment, in the step of forming the emission layer, a second cover part including the same material as the emission layer may be formed on the first cover part, and in the step of forming of the common electrode, a third cover part including the same material as the common electrode may be formed on the second cover part.

Therefore, the display device according to embodiments may include a power line and a common electrode. The power line may include a depression part, and the common electrode may contact the power line in the depression part. Accordingly, a drop in voltage provided to the common electrode may be prevented or reduced.

In addition, according to the manufacturing method of the display device according to embodiments, the depression part of the power line may be formed through an ashing and etching process using a photoresist without a separate laser drilling process. Accordingly, an efficiency of the manufacturing process of the display device may be improved.

It is to be understood that both the foregoing general description and the following detailed description are exemplary and explanatory and are intended to provide further explanation of the invention as claimed.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
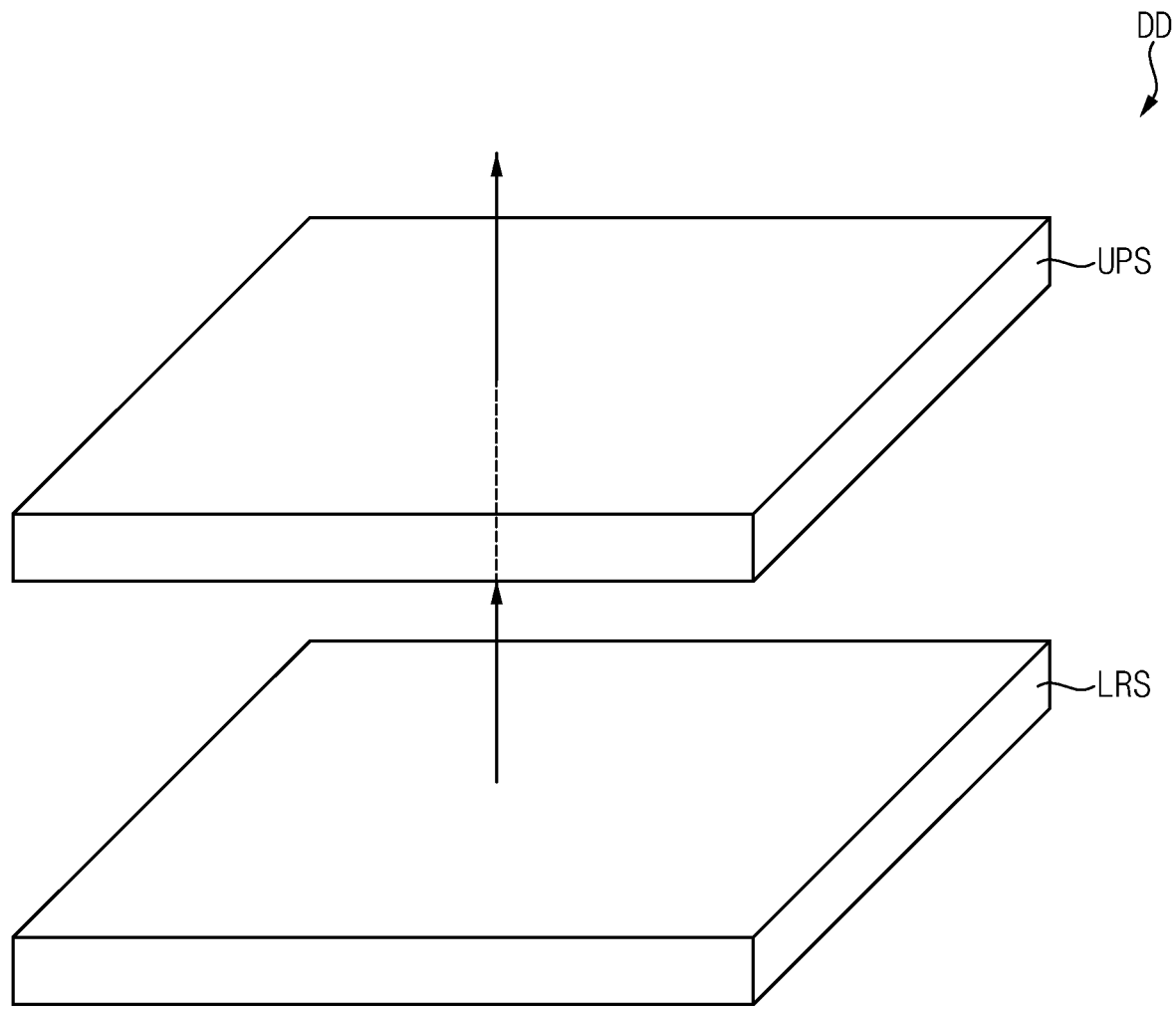
FIG. 1 is a perspective view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

FIG. 1 is a perspective view illustrating a display device according to an embodiment.

Referring to FIG. 1, a display device DD according to an embodiment may include a lower structure LRS and an upper structure UPS.

The lower structure LRS may include at least one light emitting device and may be referred to as a light emitting substrate or a display substrate. The lower structure LRS may emit light having a predetermined color.

The upper structure UPS may be disposed on the lower structure LRS. The upper structure UPS may include at least one color conversion pattern and may be referred to as a color conversion substrate. The upper structure UPS may convert a color of light emitted from the lower structure LRS.

Figure 2:
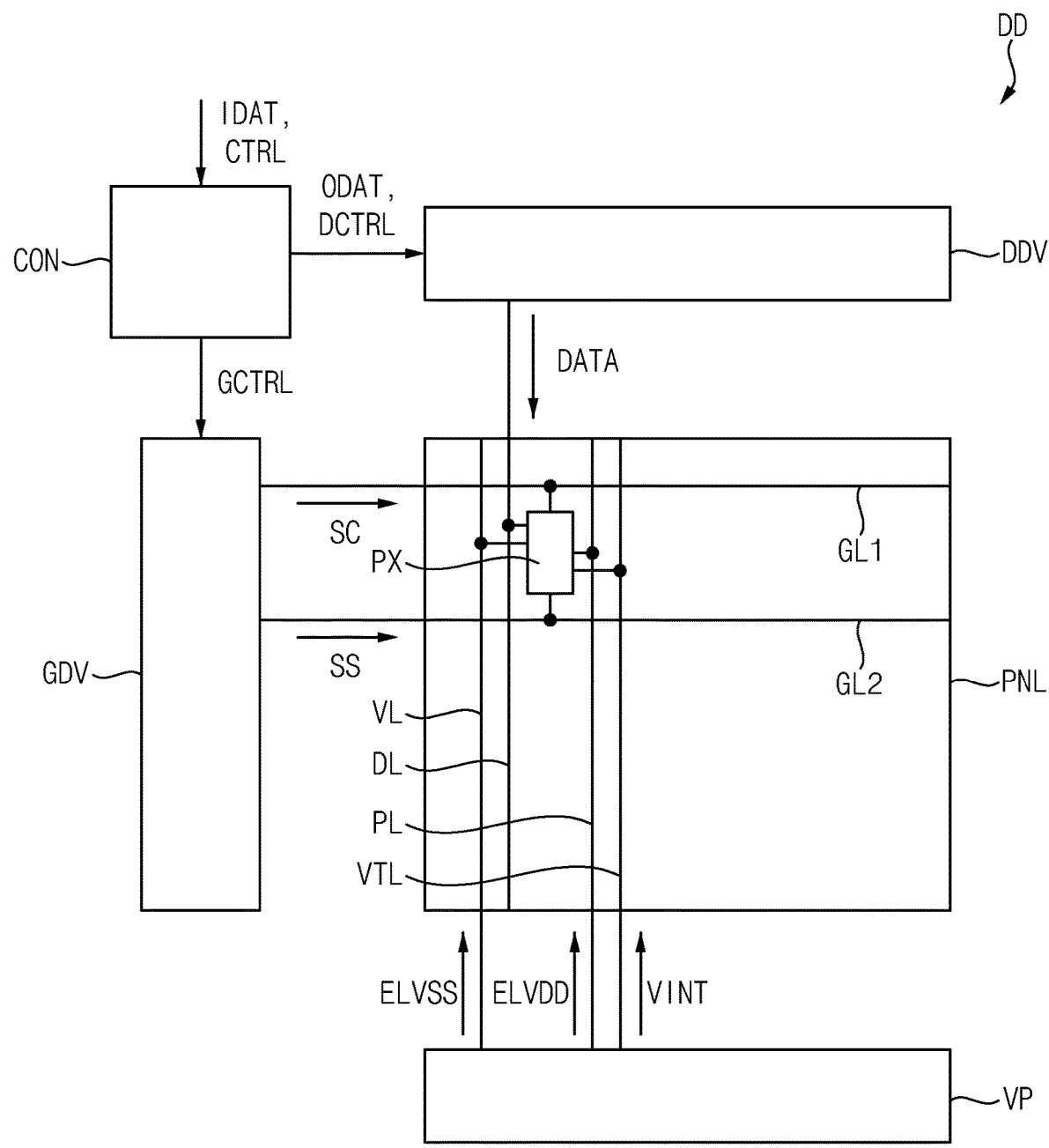
FIG. 2 is a block diagram illustrating the display device of FIG. 1.

FIG. 2 is a block diagram illustrating the display device of FIG. 1.

Referring to FIG. 2, the display device DD may include a display panel PNL, a data driver DDV, a gate driver GDV, a control part CON, and a voltage supply part VP.

The display panel PNL may include at least one pixel PX.

The pixel PX may receive a first gate signal SC through a first gate line GL1 and receive a second gate signal SS through a second gate line GL2. Also, the pixel PX may receive a data voltage DATA through a data line DL and an initialization voltage VINT through an initialization voltage line VTL. The data voltage DATA may be written in the pixel PX in response to the first gate signal SC, and the initialization voltage VINT may be written in response to the second gate signal SS.

The data driver DDV may generate the data voltage DATA based on an output image data ODAT and a data control signal DCTRL. For example, the data driver DDV may generate the data voltage DATA corresponding to the output image data ODAT and output the data voltage DATA in response to the data control signal DCTRL. The data control signal DCTRL may include an output data enable signal, a horizontal start signal, a load signal, and the like.

The gate driver GDV may generate the first and second gate signals SC and SS based on a gate control signal GCTRL. For example, each of the first gate signal SC and the second gate signal SS may include a gate-on voltage for turning on a transistor and a gate-off voltage for turning off the transistor. The gate control signal GCTRL may include a vertical start signal, a clock signal, and the like.

The control part CON (e.g., a timing controller) may receive an input image data IDAT and a control signal CTRL from an external host processor (e.g., a GPU). For example, the input image data IDAT may be a RGB data including a red image data, a green image data, and a blue image data. The control signal CTRL may include a vertical sync signal, a horizontal sync signal, an input data enable signal, a master clock signal, and the like. The control part CON may generate the gate control signal GCTRL, the data control signal DCTRL, and the output image data ODAT based on the input image data IDAT and the control signal CTRL.

The voltage supply part VP may provide a driving voltage ELVDD, a common voltage ELVSS, and an initialization voltage VINT to the pixel PX. The driving voltage ELVDD may be provided to the pixel PX through a driving line PL. The common voltage ELVSS may be provided to the pixel PX through a power line VL and a common electrode (e.g., the common electrode CTE of FIG. 4).

Figure 3:
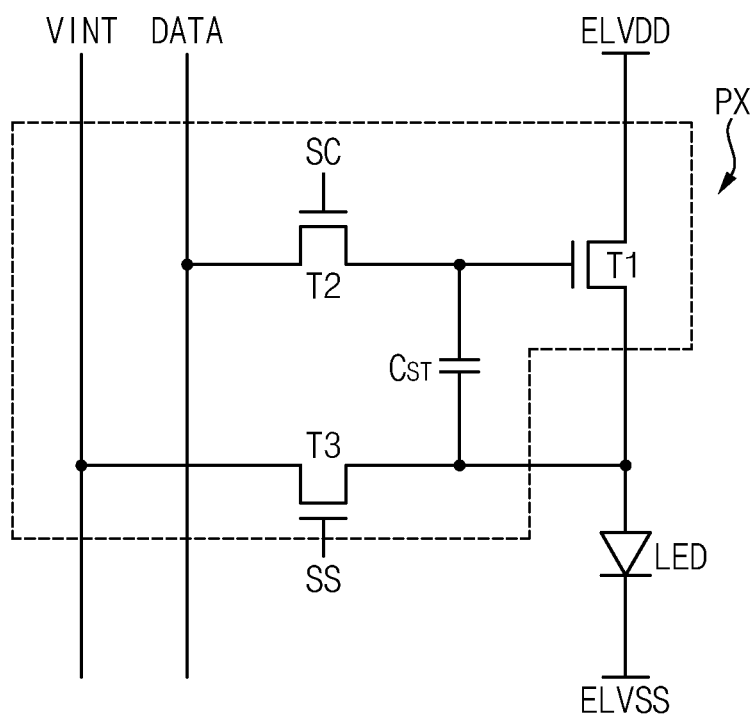
FIG. 3 is a circuit diagram illustrating the pixel included in the display device of FIG. 2.

FIG. 3 is a circuit diagram illustrating the pixel included in the display device of FIG. 2.

Referring to FIG. 3, the pixel PX may include a first transistor T1, a second transistor T2, a third transistor T3, and a storage capacitor CST. The pixel PX may be electrically connected to the light emitting device LED.

The first transistor T1 may include a first terminal, a second terminal, and a gate terminal. The first terminal may receive the driving voltage ELVDD. The second terminal may be connected to the light emitting device LED. The gate terminal may be connected to the second transistor T2. The first transistor T1 may generate a driving current based on the driving voltage ELVDD and the data voltage DATA.

The second transistor T2 may include a first terminal, a second terminal, and a gate terminal. The first terminal may receive the data voltage DATA. The second terminal may be connected to the first transistor T1. The gate terminal may receive the first gate signal SC. The second transistor T2 may transmit the data voltage DATA in response to the first gate signal SC.

The third transistor T3 may include a first terminal, a second terminal, and a gate terminal. The first terminal may be connected to the first transistor T1. The second terminal may receive the initialization voltage VINT. The gate terminal may receive the second gate signal SS. The third transistor T3 may transmit the initialization voltage VINT in response to the second gate signal SS.

The storage capacitor CST may include a first terminal and a second terminal. The first terminal may be connected to the gate terminal of the first transistor T1. The second terminal may be connected to the first terminal of the third transistor T3. The storage capacitor CST may maintain a voltage level of the gate terminal of the first transistor T1 during an inactive period of the first gate signal SC.

The light emitting device LED may include a first terminal and a second terminal. The first terminal may be connected to the second terminal of the first transistor T1. The second terminal may receive the common voltage ELVSS. The light emitting device LED may emit light having luminance corresponding to the driving current. The light emitting device LED may include an organic light emitting device using an organic material as an emission layer, an inorganic light emitting device using an inorganic material as an emission layer, and the like.

Figure 4:
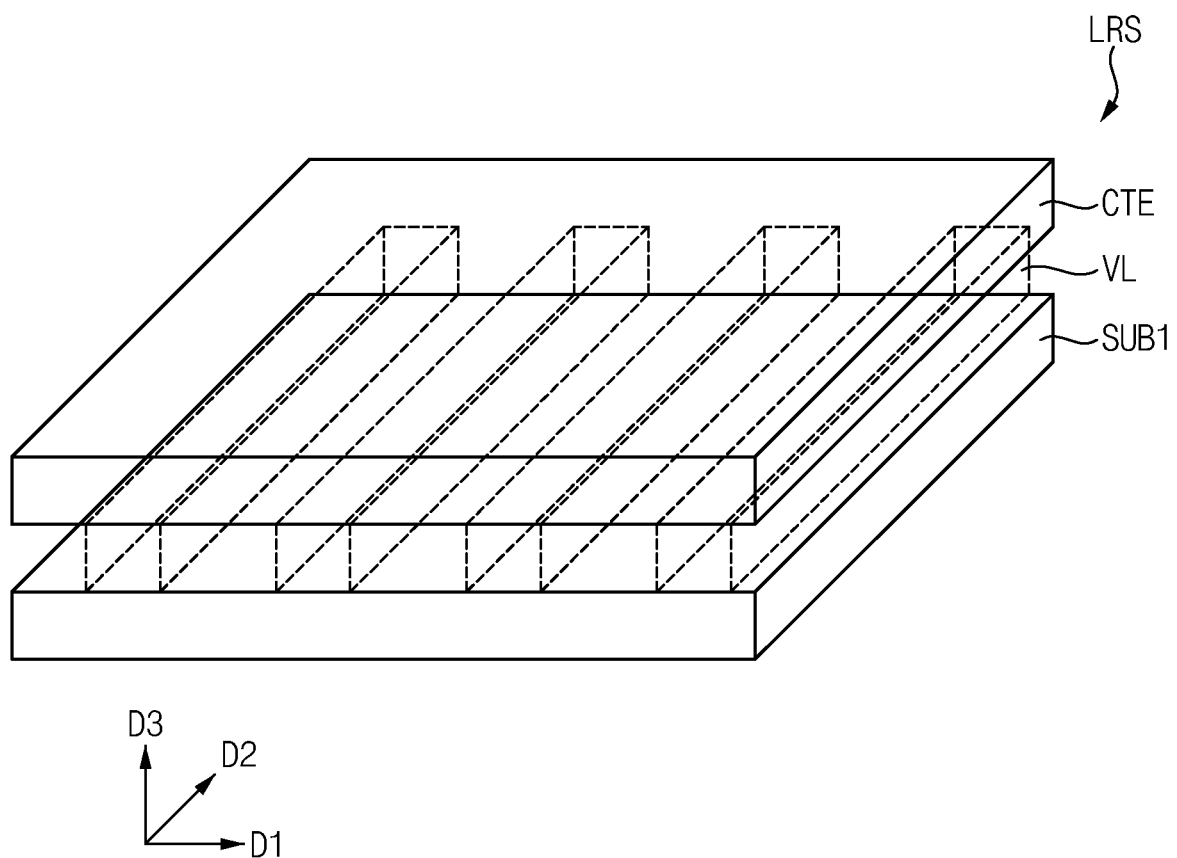
FIG. 4 is a perspective view illustrating the lower structure included in the display device of FIG. 1.

FIG. 4 is a perspective view illustrating the lower structure LRS included in the display device of FIG. 1.

The lower substrate SUB1 may be parallel to a plane having a first direction (e.g., X direction) D1 and a second direction (e.g., Y direction) D2 crossing the first direction D1 and have a thickness in a third direction (e.g., Z direction) (D3) perpendicular to the plane.

The lower substrate SUB1 may include a transparent or opaque material. In an embodiment, examples of materials that can be used as the lower substrate SUB1 may include glass, quartz, and plastic. These may be used alone or in combination with each other.

The power line VL may be disposed on the lower substrate SUB1. In an embodiment, the power line VL may extend in the second direction D2 and may be spaced apart from each other in the first direction D1. The power line VL may transmit the common voltage ELVSS to the common electrode CTE. The power line VL may prevent a voltage drop of the common voltage ELVSS.

In another embodiment, the power line VL may extend in the first direction D1 and may be spaced apart from each other in the second direction D2. In still another embodiment, the power line VL may include a first power line and a second power line disposed on the first power line.

The common electrode CTE may be disposed on the power line VL. In an embodiment, the common electrode CTE may be formed as a plate electrode. The common electrode CTE may receive the common voltage ELVSS from the power line VL. For example, the common electrode CTE may correspond to the second terminal of the light emitting device LED described with reference to FIG. 3.

Figure 5:
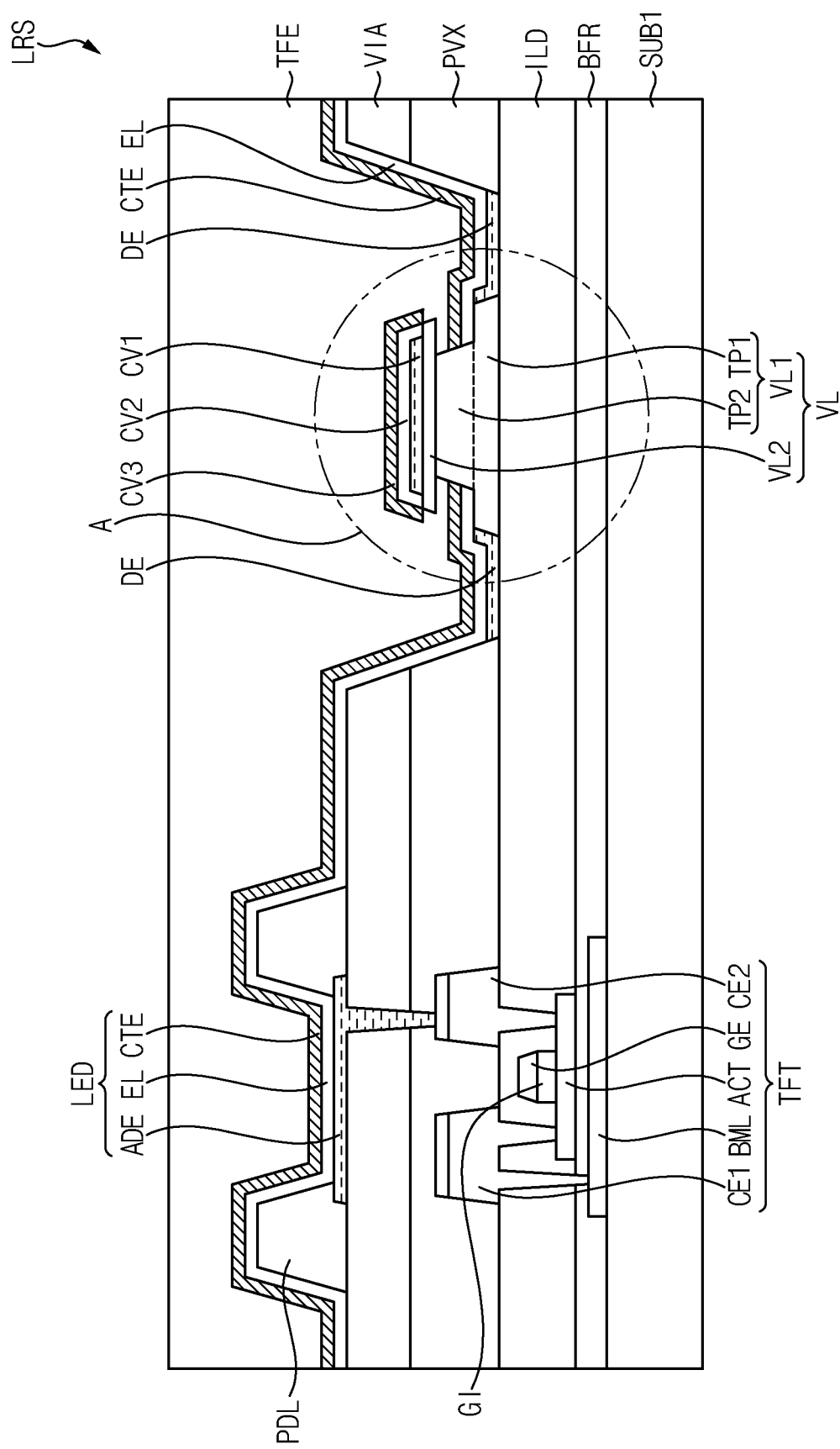
FIG. 5 is a cross-sectional view illustrating the lower structure included in the display device of FIG. 1.

FIG. 5 is a cross-sectional view illustrating the lower structure LRS included in the display device of FIG. 1.

Referring to FIG. 5, the lower structure LRS may include the lower substrate SUB1, a lower metal pattern BML, a buffer layer BFR, an active pattern ACT, a gate insulating pattern GI, a gate electrode GE, an interlayer insulating layer ILD, a first connection electrode CE1, a second connection electrode CE2, the power line VL, dummy electrodes DE, a passivation layer PVX, a via insulating layer VIA, a pixel electrode ADE, a pixel defining layer PDL, an emission layer EL, the common electrode CTE, and first to third cover parts CV1, CV2, CV3.

The lower metal pattern BML may be disposed on the lower substrate SUB1. In an embodiment, the lower metal pattern BML may be formed of a metal, an alloy, a conductive metal oxide, a transparent conductive material, or the like. Examples of materials that can be used as the lower metal pattern BML may include silver (Ag), an alloy containing silver, molybdenum (Mo), an alloy containing molybdenum, aluminum (Al), and an alloy containing aluminum. Other examples include, aluminum nitride (AlN), tungsten (W), tungsten nitride (WN), copper (Cu), nickel (Ni), chromium (Cr), chromium nitride (CrN), titanium (Ti), tantalum (Ta), It may be platinum (Pt), scandium (Sc), indium tin oxide (ITO), indium zinc oxide (IZO), and the like. These may be used alone or in combination with each other. Also, the lower metal pattern BML may be formed as a single layer or as multiple layers in combination with each other.

The buffer layer BFR may be disposed on the lower substrate SUB1 and cover the lower metal pattern BML. The buffer layer BFR may prevent impurities such as oxygen and moisture from diffusing onto the lower substrate SUB1 through the lower substrate SUB1. The buffer layer BFR may include an inorganic insulating material such as a silicon compound or a metal oxide. Examples of the inorganic insulating material may include silicon oxide (SiO), silicon nitride (SiN), silicon oxynitride (SiON), silicon oxycarbide (SiOC), silicon carbonitride (SiCN), aluminum oxide (AlO), and aluminum nitride. (AlN), tantalum oxide (TaO), hafnium oxide (HfO), zirconium oxide (ZrO), and titanium oxide (TiO). These may be used alone or in combination with each other. The buffer layer BFR may have a single-layer structure or a multi-layer structure including a plurality of insulating layers.

The active pattern ACT may be disposed on the buffer layer BFR. In an embodiment, the active pattern ACT may be formed of a silicon semiconductor material or an oxide semiconductor material. Examples of the silicon semiconductor material that can be used as the active pattern ACT may include amorphous silicon and polycrystalline silicon. Examples of the oxide semiconductor material that can be used as the active pattern ACT may include IGZO (InGaZnO) and ITZO (InSnZnO). In addition, the oxide semiconductor material may further include indium (In), gallium (Ga), tin (Sn), zirconium (Zr), vanadium (V), hafnium (Hf), cadmium (Cd), germanium (Ge), chromium (Cr)), titanium (Ti), and zinc (Zn). These may be used alone or in combination with each other.

The gate insulating pattern GI may be disposed on the active pattern ACT. In an embodiment, the gate insulating pattern GI may be formed of an insulating material. Examples of an insulating material that can be used as the gate insulating pattern GI may include silicon oxide, silicon nitride, and silicon oxynitride. These may be used alone or in combination with each other.

The gate electrode GE may be disposed on the gate insulating pattern GI. In an embodiment, the gate electrode GE may be formed of metal, alloy, conductive metal oxide, transparent conductive material, or the like. Examples of materials that can be used as the gate electrode GE may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other.

The interlayer insulating layer ILD may be disposed on the buffer layer BFR and the gate insulating pattern GI. The interlayer insulating layer ILD may cover the gate electrode GE. A contact hole may be defined in the interlayer insulating layer ILD. The contact hole may expose a portion of the active pattern ACT. In an embodiment, the interlayer insulating layer ILD may be formed of an inorganic insulating material. Examples of inorganic insulating materials that can be used as the interlayer insulating layer ILD may include silicon oxide, silicon nitride, and silicon oxynitride. These may be used alone or in combination with each other.

The first connection electrode CE1 and the second connection electrode CE2 may be disposed on the interlayer insulating layer ILD. The first connection electrode CE1 may be electrically connected to the active pattern ACT through the contact hole formed through the interlayer insulating layer ILD. Also, the first connection electrode CE1 may be electrically connected to the lower metal pattern BML through the contact hole formed through the interlayer insulating layer ILD and the buffer layer BFR. The second connection electrode CE2 may be electrically connected to the active pattern ACT through the contact hole formed through the interlayer insulating layer ILD. In an embodiment, each of the first connection electrode CE1 and the second connection electrode CE2 may include a plurality of conductive layers.

The lower metal pattern BML, the active pattern ACT, the gate electrode GE, the first connection electrode CE1, and the second connection electrode CE2 may constitute a thin film transistor TFT. For example, the thin film transistor TFT may correspond to at least one of the first to third transistors T1, T2, and T3 described with reference to FIG. 3.

The power line VL may be disposed on the interlayer insulating layer ILD. In an embodiment, the power line VL may be formed together with the first connection electrode CE1 and the second connection electrode CE2. In other words, the power line VL may be disposed on the same layer as the first connection electrode CE1 and the second connection electrode CE2.

Figure 6:
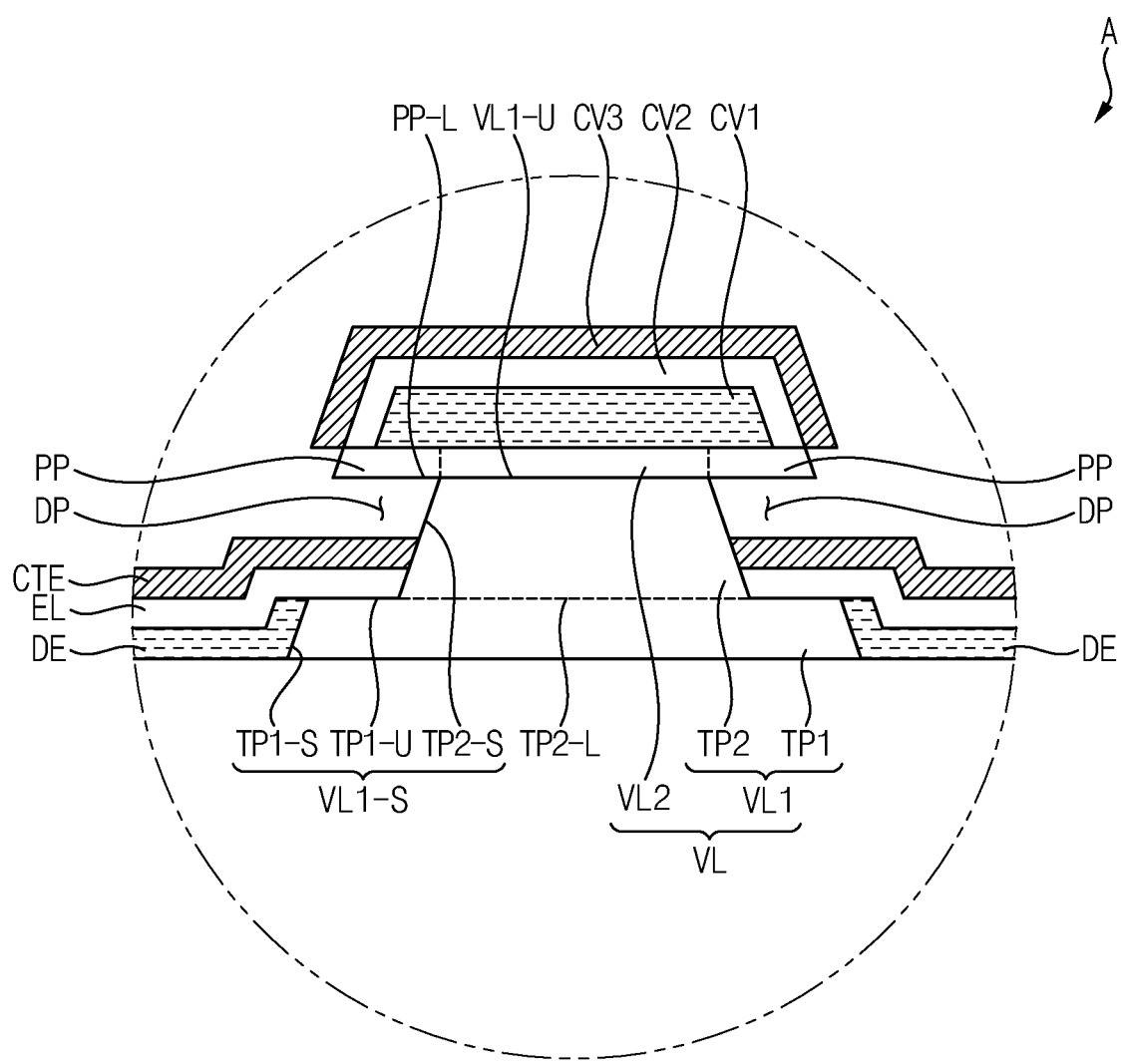
FIG. 6 is an enlarged view of area 'A' of FIG. 5.

FIG. 6 is an enlarged view of area 'A' of FIG. 5.

Referring to FIGS. 5 and 6, in an embodiment, the power line VL may include a first conductive layer VL1 and a second conductive layer VL2 disposed on the first conductive layer VL1.

In an embodiment, the first conductive layer VL1 and the second conductive layer VL2 may include different materials each other. For example, the first conductive layer VL1 may include copper (Cu), and the second conductive layer VL2 may include indium tin oxide (ITO) or titanium (Ti).

In an embodiment, the first conductive layer VL1 may increase in width from the second conductive layer VL2 toward the interlayer insulating layer ILD. In an embodiment, a side surface VL1-S of the first conductive layer VL1 may have a step.

In an embodiment, the first conductive layer VL1 may include a first tapered part TP1 and a second tapered part TP2 positioned on the first tapered part TP1. Each of the first tapered part TP1 and the second tapered part TP2 may have a tapered shape. In other words, each of the first tapered part TP1 and the second tapered part TP2 may have a width of an upper surface narrower than a width of a lower surface. In other words, each of the first tapered part TP1 and the second tapered part TP2 may increase in width from the second conductive layer VL2 toward the interlayer insulating layer ILD.

In an embodiment, an upper surface TP1-U of the first tapered part TP1 may have a first width and a lower surface TP2-L of the second tapered part TP2 may have a second width smaller than the first width. In other words, a portion of the upper surface TP1-U of the first tapered part TP1 may be exposed from the second tapered part TP2. In other words, a side surface TP1-S of the first tapered part TP1 may protrude from a side surface TP2-S of the second tapered part TP2.

In this case, the side surface TP1-S of the first tapered part TP1, the upper surface TP1-U of the first tapered part TP1, and the side surface TP2-S of the second tapered part TP2 may constitute the side surface VL1-S of the first conductive layer VL1.

In an embodiment, the second conductive layer VL2 may have a tapered shape. In other words, the upper surface of the second conductive layer VL2 may have a width of an upper surface narrower than a width of a lower surface. In an embodiment, the second conductive layer VL2 may include a protrusion part PP spaced apart from an upper surface VL1-U of the first conductive layer VL1. In other words, the second conductive layer VL2 may protrude from the side surface TP2-S of the second tapered part TP2 of the first conductive layer VL1.

In an embodiment, the power line VL may have a depression part DP defined by the upper surface TP1-U of the first tapered part TP1, the side surface TP2-S of the second tapered part TP2, and a lower surface PP-L of the protrusion part PP of the second conductive layer VL2. In other words, an undercut shape may be formed in the power line VL. The undercut shape may be formed using a characteristic that the first conductive layer VL1 and the second conductive layer VL2 have different etching rates in the same etching process. In an embodiment, the emission layer EL and the common electrode CTE may be disposed in the depression part DP. For example, the emission layer EL and the common electrode CTE may contact the side surface VL1-S of the first conductive layer VL1 in the depression part DP.

In an embodiment, a length of the lower surface PP-L of the protrusion part PP may be about 0.1 micrometers to about 1.0 micrometers. Specifically, the length of the lower surface PP-L of the protrusion part PP may be about 0.2 micrometers to about 0.3 micrometers.

The passivation layer PVX may be disposed on the interlayer insulating layer ILD. The passivation layer PVX may cover the first connection electrode CE1 and the second connection electrode CE2. In an embodiment, the passivation layer PVX may be formed of an insulating material. Examples of an insulating material that can be used as the passivation layer PVX may include silicon oxide, silicon nitride, and silicon oxynitride. These may be used alone or in combination with each other. In addition, the passivation layer PVX may have a single-layer structure or a multi-layer structure including a plurality of insulating layers.

The via insulating layer VIA may be disposed on the passivation layer PVX. In an embodiment, the via insulating layer VIA may be formed of an insulating material. Examples of insulating materials that can be used as the via insulating layer VIA may include photoresist, polyacrylic resin, polyimide resin, and acrylic resin. These may be used alone or in combination with each other.

An opening exposing an upper surface of the interlayer insulating layer ILD and the power line VL may be formed in the passivation layer PVX and the via insulating layer VIA. Accordingly, the power line VL may contact the common electrode CTE.

The pixel electrode ADE may be disposed on the via insulating layer VIA. The pixel electrode ADE may be electrically connected to the thin film transistor TFT through a contact hole formed through the via insulating layer VIA. For example, the pixel electrode ADE may correspond to the first terminal of the light emitting device LED described with reference to FIG. 3. In an embodiment, the pixel electrode ADE may be formed of a metal, an alloy, a conductive metal oxide, a transparent conductive material, or the like. Examples of materials that can be used as the pixel electrode ADE may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like.

Meanwhile, the dummy electrodes DE may be disposed on the interlayer insulating layer ILD exposed by the passivation layer PVX and the via insulating layer VIA. In other words, the dummy electrodes DE may be disposed on the same layer as the power line VL. In an embodiment, the dummy electrodes DE may be formed of the same material as the pixel electrode ADE. Examples of materials that can be used for the dummy electrodes DE may include silver (Ag), an alloy containing silver, molybdenum (Mo), an alloy containing molybdenum, aluminum (Al), and an alloy containing aluminum, alloy, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like.

In an embodiment, each of the dummy electrodes DE may contact the power line VL. In detail, each of the dummy electrodes DE may contact the side surface VL1-S of the first conductive layer VL1. However, the present invention is not necessarily limited thereto, and in another embodiment, each of the dummy electrodes DE may be spaced apart from the power line VL. Also, some of the dummy electrodes DE may contact the power line VL, and others may be spaced apart from the power line VL.

Meanwhile, the first cover part CV1 may be disposed on the second conductive layer VL2 of the power line VL. The first cover part CV1 may be formed of the same material as the pixel electrode ADE and the dummy electrodes DE. In an embodiment, the first cover part CV1 may be disconnected from the dummy electrodes DE by the depression part DP of the power line VL. In other words, the first cover part CV1 may be disconnected from the dummy electrodes DE by the undercut shape of the power line VL.

The pixel defining layer PDL may be disposed on the via insulating layer VIA. In an embodiment, the pixel defining layer PDL may be formed of an insulating material. Examples of insulating materials that can be used as the pixel defining layer PDL may include photoresist, polyacrylic resin, polyimide resin, and acrylic resin. These may be used alone or in combination with each other. In an embodiment, a pixel opening exposing an upper surface of the pixel electrode PE may be formed in the pixel defining layer PDL.

The emission layer EL may be disposed on the pixel electrode ADE, the dummy electrodes DE, the pixel defining layer PDL, and the via insulating layer VIA. In an embodiment, the emission layer EL may have a multilayer structure including a hole injection layer, a hole transport layer, an organic emission layer, an electron transport layer, and an electron injection layer.

In an embodiment, the emission layer EL may contact the power line VL. Specifically, the emission layer EL may contact the side surface VL1-S of the first conductive layer VL1. For example, the emission layer EL may contact the side surface VL1-S of the first conductive layer VL1 in the depression part DP of the first conductive layer VL1.

Meanwhile, the second cover part CV2 may be disposed on the first cover part CV1. The second cover part CV2 may be formed together with the emission layer EL. In other words, the second cover part CV2 may be formed of the same material as the emission layer EL. In an embodiment, the second cover part CV2 may be disconnected from the emission layer EL by the depression part DP of the power line VL. In other words, the second cover part CV2 may be disconnected from the emission layer EL by the undercut shape of the power line VL.

The common electrode CTE may be disposed on the emission layer EL. In an embodiment, the common electrode CTE may be formed of a metal, an alloy, a conductive metal oxide, a transparent conductive material, or the like. Examples of materials that can be used as the common electrode CTE may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other. Also, the common electrode CTE may have a single-layer structure or a multi-layer structure including a plurality of insulating layers.

In an embodiment, the common electrode CTE may contact the power line VL. Specifically, the common electrode CTE may contact the side surface VL1-S of the first conductive layer VL1. For example, the common electrode CTE may contact the side surface VL1-S of the first conductive layer VL1 in the depression part DP of the first conductive layer VL1. Accordingly, the common electrode CTE may be electrically connected to the power line VL.

Meanwhile, the third cover part CV3 may be disposed on the second cover part CV2. The third cover part CV3 may be formed together with the common electrode CTE. In other words, the third cover part CV3 may be formed of the same material as the common electrode CTE. In an embodiment, the third cover part CV3 may be disconnected from the common electrode CTE by the depression part DP of the power line VL. In other words, the third cover part CV3 may be disconnected from the common electrode CTE by the undercut shape of the power line VL.

A thin film encapsulation layer TFE may be disposed on the common electrode CTE. The thin film encapsulation layer TFE may prevent penetration of external moisture and oxygen. The thin film encapsulation layer TFE may include at least one organic encapsulation layer and at least one inorganic encapsulation layer.

According to embodiments, the display device DD may include a power line VL and a common electrode CTE, the power line VL may have the depression part DP, and the common electrode CTE may contact the power line VL in the depression part DP. Accordingly, a voltage drop of the voltage provided to the common electrode CTE may be prevented.

Figure 7:
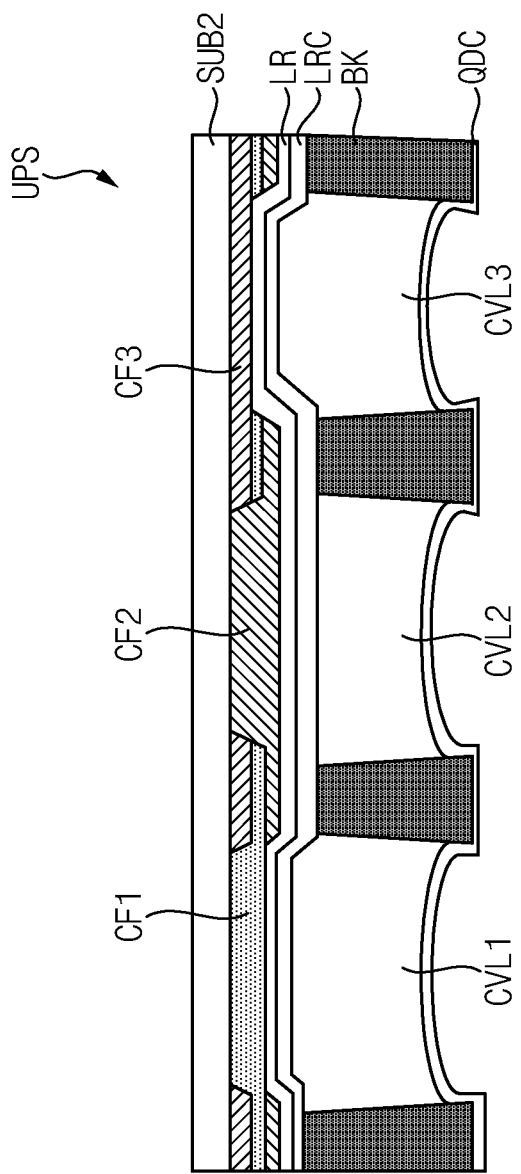
FIG. 7 is a cross-sectional view illustrating the upper structure included in the display device of FIG. 1.

FIG. 7 is a cross-sectional view illustrating the upper structure included in the display device of FIG. 1.

Referring to FIG. 7, the upper structure UPS may include an upper substrate SUB2, a first color filter CF1, a second color filter CF2, a third color filter CF3, a refractive layer LR, a refractive capping layer LRC, a bank layer BK, a first color conversion pattern CVL1, a second color conversion pattern CVL2, a third color conversion pattern CVL3, and a color conversion capping layer QDC.

The upper substrate SUB2 may include a transparent or opaque material. In an embodiment, examples of materials that can be used as the upper substrate SUB2 may include glass, quartz, and plastic. These may be used alone or in combination with each other.

The first color filter CF1, the second color filter CF2, and the third color filter CF3 may be disposed under the upper substrate SUB2. In an embodiment, the first color filter CF1 may transmit light having a wavelength corresponding to red light, the second color filter CF2 may transmit light having a wavelength corresponding to green light, and the third color filter CF3 may transmit light having a wavelength corresponding to blue light. An area where the first color filter CF1, the second color filter CF2, and the third color filter CF3 overlap may function as a light blocking layer.

The refraction layer LR may be disposed under the first to third color filters CF1, CF2, and CF3. The refractive layer LR may have a predetermined refractive index. Accordingly, light efficiency of the display device DD may be improved. In another embodiment, the refractive layer LR may be disposed under the first to third color conversion patterns CVL1, CVL2, CVL3. In still another embodiment, the refractive layer LR may include first and second refractive layers, and the first refractive layer may be disposed on the first to third color conversion patterns CVL1, CVL2, CVL3 and the second refractive layer may be disposed under the first to third color conversion patterns CVL1, CVL2, CVL3.

The refractive capping layer LRC may be disposed under the refractive layer LR. The refractive capping layer LRC may protect the refractive layer LR. In another embodiment, the refractive capping layer LRC may be disposed on the refractive layer LR. In still another embodiment, a first capping layer may be disposed below the refraction layer LR and the second capping layer may be disposed above the refraction layer LR.

The bank layer BK may be disposed under the refractive capping layer LRC. The bank layer BK may be formed of a light blocking material and may block light emitted from a lower portion. Also, an opening exposing the refractive capping layer LRC may be formed in the bank layer BK.

The first color conversion pattern CVL1 may be disposed under the first color filter CF1 and convert a wavelength of light emitted from the light emission layer EL. For example, the first color conversion pattern CVL1 may include a phosphor, a scattering material, or a quantum dot. As light emitted from the emission layer EL passes through the first color conversion pattern CVL1, red light may be emitted.

The second color conversion pattern CVL2 may be disposed under the second color filter CF2 and convert a wavelength of light emitted from the emission layer EL. For example, the second color conversion pattern CVL2 may include a phosphor, a scattering material, or a quantum dot. As light emitted from the emission layer EL passes through the second color conversion pattern CVL2, green light may be emitted.

The third color conversion pattern CVL3 may be disposed under the third color filter CF3 and may scatter a wavelength of light emitted from the emission layer EL. For example, the third color conversion pattern CVL3 may include a phosphor, a scattering material, or a quantum dot. As light emitted from the emission layer EL passes through the third color conversion pattern CVL3, blue light may be emitted.

In an embodiment, each of the first to third color conversion patterns CVL1, CVL2, and CVL3 may have a concave cross-sectional shape.

The color conversion capping layer QDC may be disposed under the first to third color conversion patterns CVL1, CVL2, and CVL3. The color conversion capping layer QDC may protect the first to third color conversion patterns CVL1, CVL2, and CVL3.

Figure 18:
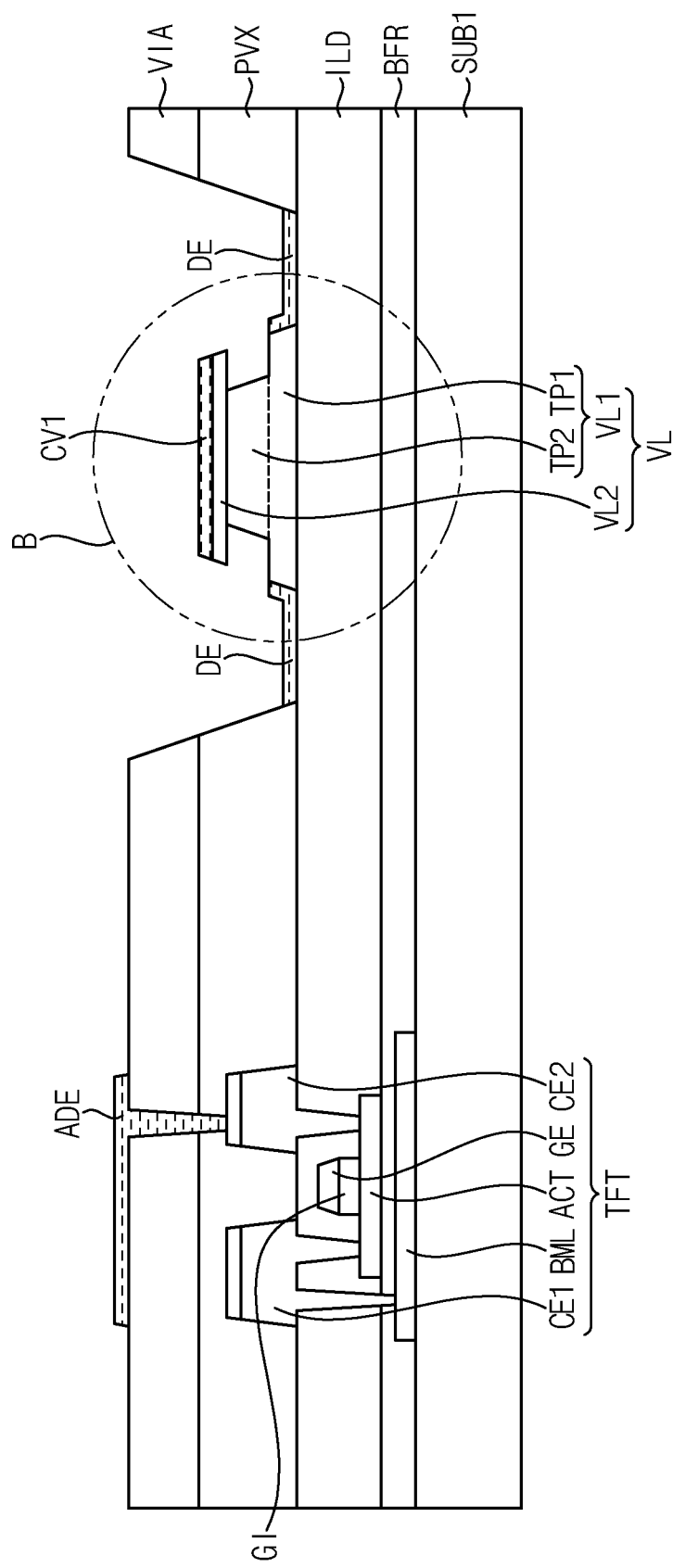
Figure 19:
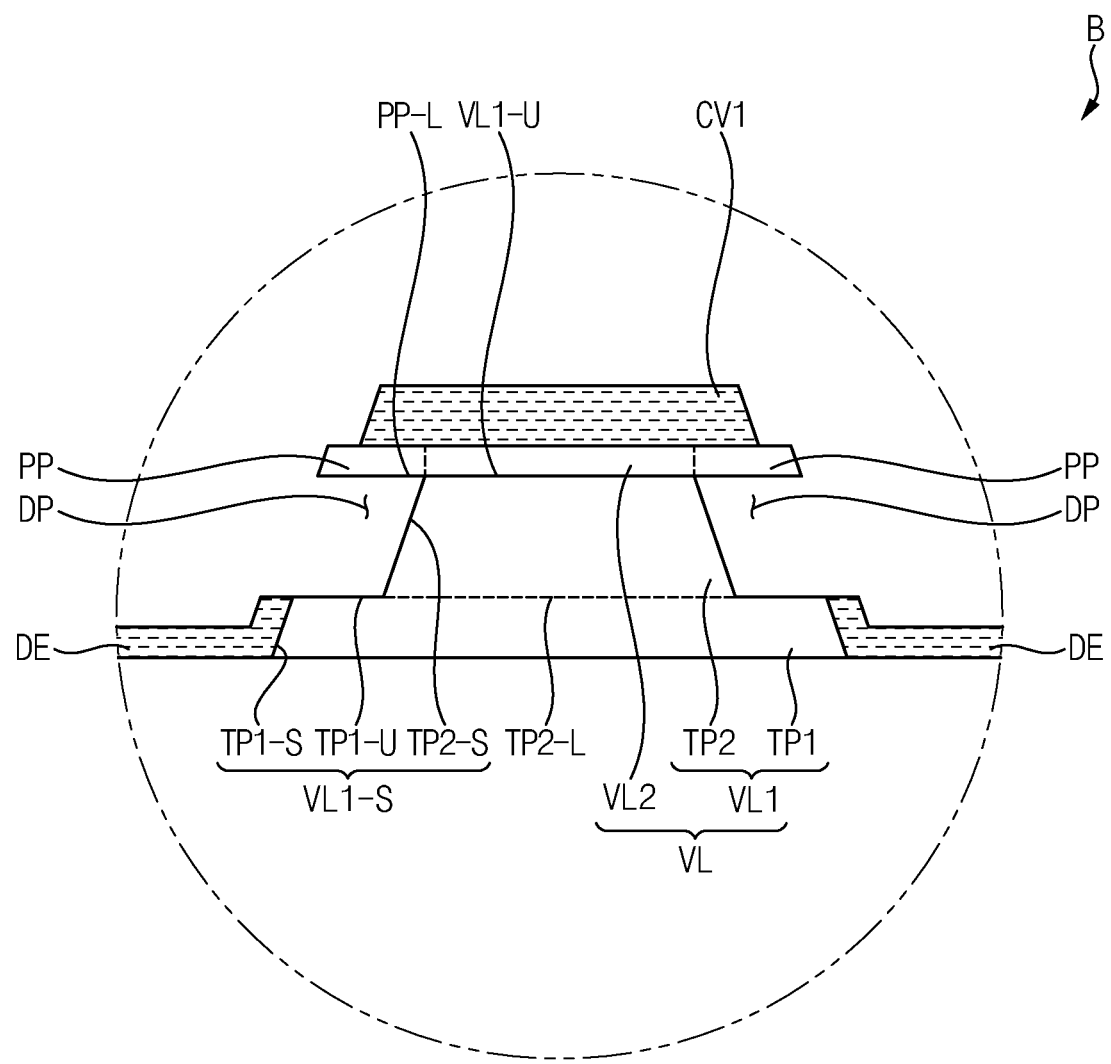

FIGS. 8 to 22 are cross-sectional views illustrating a method of manufacturing the lower structure of FIG. 5. FIG. 19 is an enlarged view of area 'B' of FIG. 18 and FIG. 21 is an enlarged view of area 'C' of FIG. 20.

Figure 8:
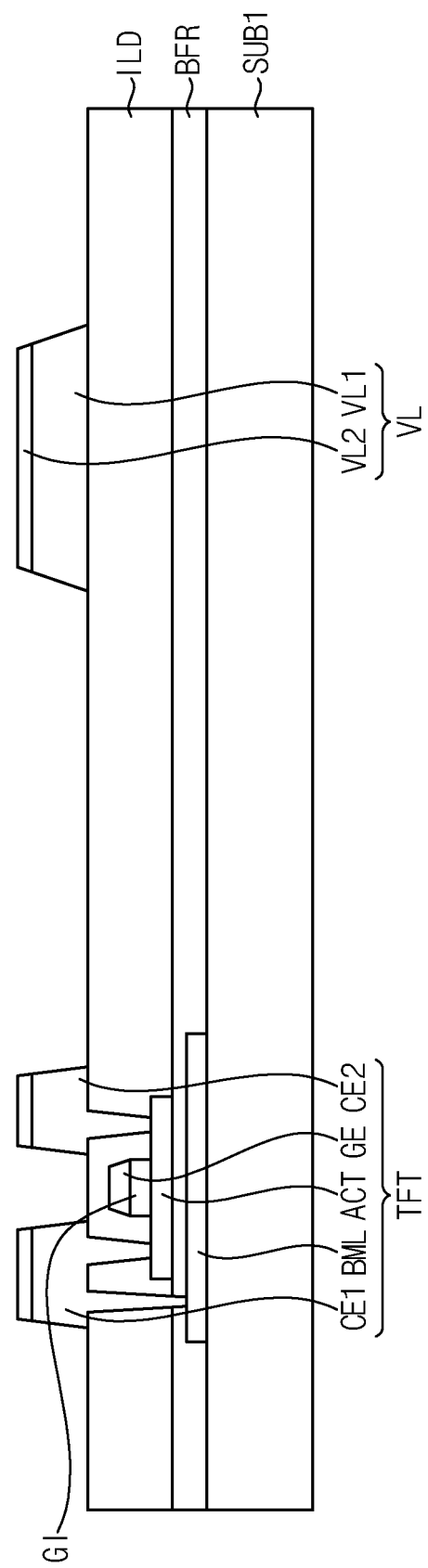
FIGS. 8, 9, 10, 11, 12, 13, 14, 15, 16, 17, 18, 19, 20, 21, and 22 are cross-sectional views illustrating a method of manufacturing the lower structure of FIG. 5.

Referring to FIG. 8, the lower metal pattern BML, the buffer layer BFR, the active pattern ACT, the gate insulating pattern GI, the gate electrode GE, the interlayer insulating layer ILD, the first connection electrode CE1, the second connection electrode CE2, and the power line VL may be formed. The first connection electrode CE1, the second connection electrode CE2, and the power line VL may be formed by coating a metal layer on the interlayer insulating layer ILD and patterning the metal layer. In an embodiment, the metal layer may include a first metal layer and a second metal layer. For example, the power line VL may include the first conductive layer VL1 formed from the first metal layer and the second conductive layer VL2 formed from the second metal layer. In an embodiment, the first conductive layer VL1 and the second conductive layer VL2 may be formed of different materials each other.

Figure 9:
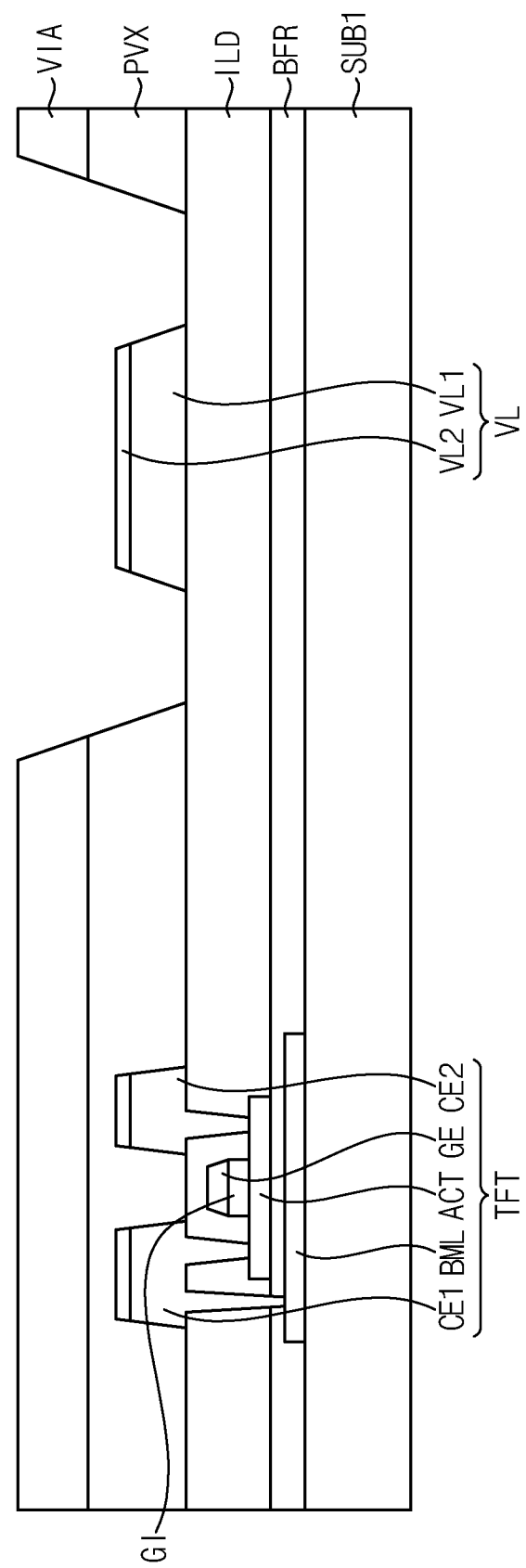

Referring to FIG. 9, the plurality of insulating layers defining an opening exposing the upper surface of the interlayer insulating layer ILD and the power line VL may be formed on the interlayer insulating layer ILD. In an embodiment, the plurality of insulating layers may cover the first connection electrode CE1 and the second connection electrode CE2. In an embodiment, the plurality of insulating layers may include the passivation layer PVX disposed on the interlayer insulating layer ILD and the via insulating layer VIA disposed on the passivation layer PVX.

In an embodiment, the opening defined by the plurality of insulating layers may be formed by forming the via insulation layer VIA exposing a portion of the passivation layer PVX after forming the passivation layer PVX on the interlayer insulating layer ILD and patterning the passivation layer PVX using the via insulating layer VIA as a mask. Accordingly, the plurality of insulating layers may be formed using a single mask process. Accordingly, the economic efficiency of the manufacturing process of the display device DD may be improved.

Figure 10:
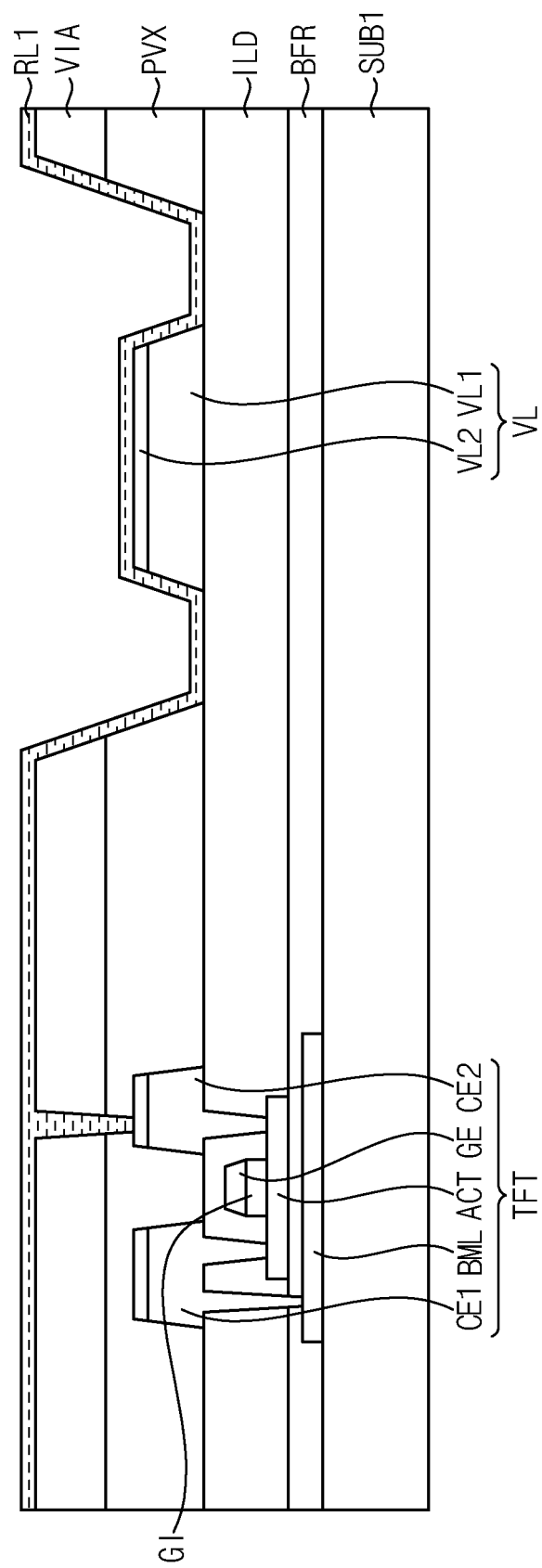

Referring to FIG. 10, a first preliminary layer RL1 may be formed to cover the interlayer insulating layer ILD, the passivation layer PVX, the via insulating layer VIA, and the power line VL. The first preliminary layer RL1 may be electrically connected to the second connection electrode CE2 through the contact hole formed through the passivation layer PVX and the via insulation layer VIA. In an embodiment, the first preliminary layer RL1 may be formed of a metal, an alloy, a conductive metal oxide, a transparent conductive material, or the like. Examples of materials that can be used as the first preliminary layer RL1 may include silver (Ag), an alloy containing silver, molybdenum (Mo), an alloy containing molybdenum, aluminum (Al), and aluminum containing alloy, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like.

Figure 11:
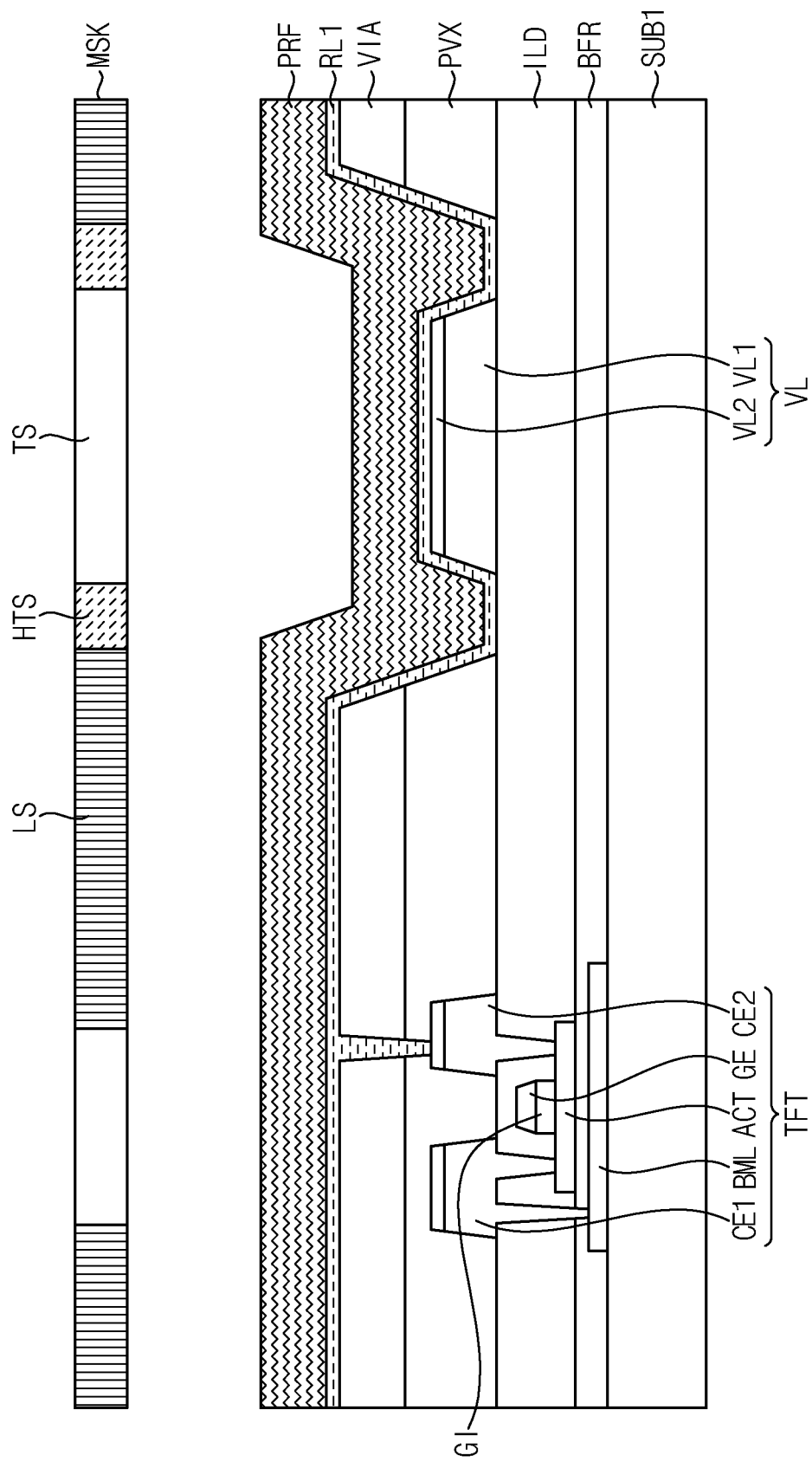
Figure 12:
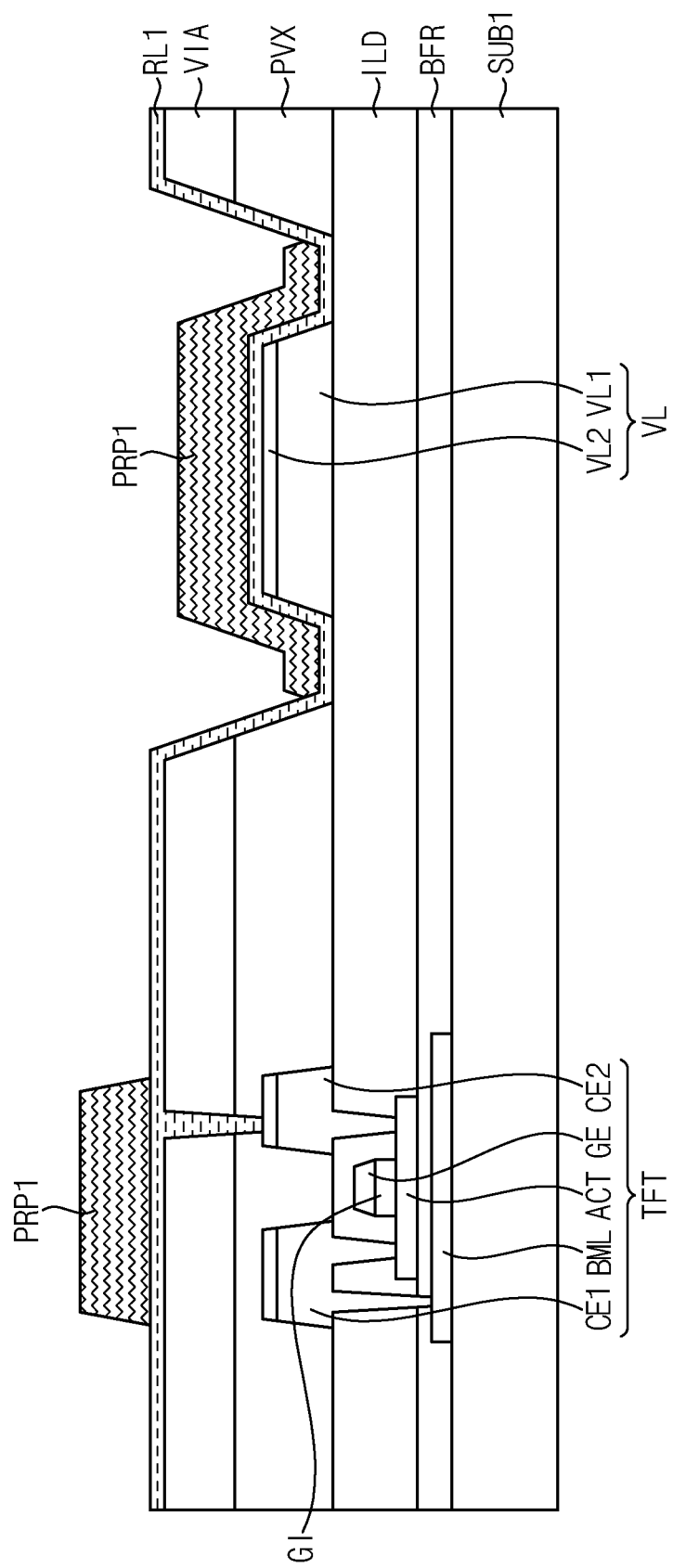

Referring to FIGS. 11 and 12, a first photoresist pattern PRP1 may be formed by coating a photoresist film PRF on the first preliminary layer RL1 and patterning the photoresist film PRF. As shown in FIG. 12, the first photoresist pattern PRP1 may be formed to expose a portion of the first preliminary layer RL1.

In an embodiment, the first photoresist pattern PRP1 may be formed by disposing an exposure mask MSK on the photoresist film PRF, exposing and developing the photoresist film PRF.

In this case, the exposure mask MSK may include a light blocking part LS, a first light transmitting part TS, and a second light transmitting part HTS. In an embodiment, the light blocking part LS may be an area blocking incident light incident on the exposure mask MSK, and the first light transmitting part TS and the second light transmitting part HTS may be a area through which the incident light is transmitted.

In an embodiment, the first light transmitting part TS may have a first light transmittance, and the second light transmitting part HTS may have a second light transmittance lower than the first light transmittance. For example, the first light transmitting part TS may transmit the incident light as it is, and the second light transmitting part HTS may transmit only a part of the incident light. For example, the second light transmitting part HTS may transmit about 50% or less of the incident light incident on the second light transmitting part HTS.

Accordingly, the incident light may not be irradiated to an area of the photoresist film PRF corresponding to the light blocking part LS. In addition, most of the incident light may be irradiated to an area of the photoresist film PRF corresponding to the first light transmitting part TS. In addition, only a portion of the incident light may be irradiated to an area of the photoresist film PRF corresponding to the second light transmitting part HTS.

In an embodiment, the power line VL may overlap a portion of the area of the photoresist film PRF corresponding to the first light transmitting part TS and spaced apart from the area of the photoresist film PRF corresponding to the second light transmitting part HTS and the area of the photoresist film PRF corresponding to the light blocking part LS.

Accordingly, by developing the photoresist film PRF, all of the photoresist film PRF corresponding to the light blocking part LS may be removed, all of the photoresist film PRF corresponding to the first light transmitting part TS may remain, and only a portion of the photoresist film PRF corresponding to the second light transmitting part HTS may be removed. Accordingly, as shown in FIG. 12, the first photoresist pattern PRP1 exposing the portion of the first preliminary layer RL1 may be formed.

Meanwhile, in FIGS. 11 and 12, the case where the photoresist film PRF includes a negative photosensitive material has been described as an example, but the present invention is not necessarily limited thereto, and in another embodiment, the photoresist film PRF may include a positive photosensitive material. In this case, areas of the exposure mask MSK corresponding to the light blocking part LS and the first light transmitting part TS may be opposite.

Figure 13:
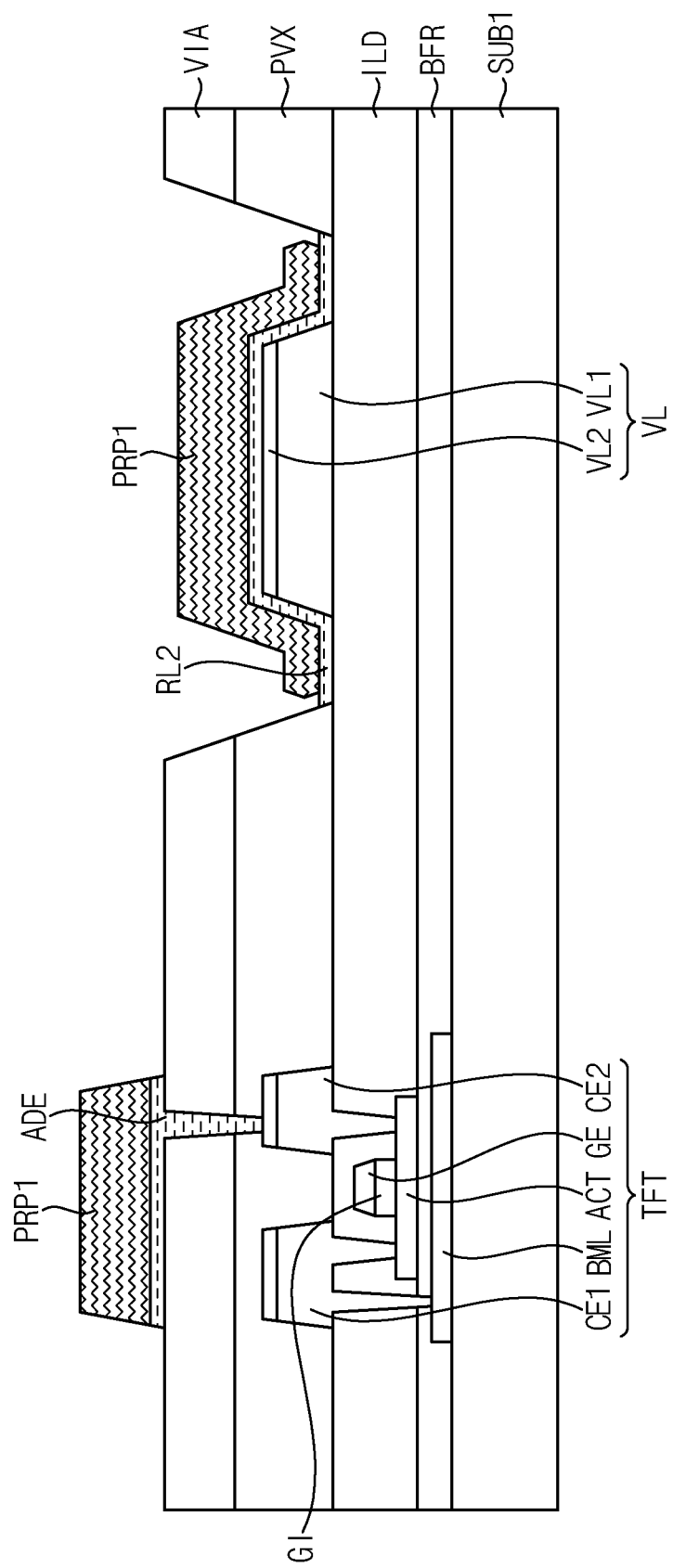

Referring to FIG. 13, the pixel electrode ADE and the second preliminary layer RL2 may be formed by removing the first preliminary layer RL1 exposed by the first photoresist pattern PRP1. The pixel electrode ADE may be formed on the via insulating layer VIA and electrically connected to the second connection electrode CE2 through the contact hole formed through the passivation layer PVX and the via insulating layer VIA. The second preliminary layer RL2 may be formed to cover the power line VL. In an embodiment, the first preliminary layer RL1 exposed by the first photoresist pattern PRP1 may be removed through a repetitive wet etching process, but the present invention is not necessarily limited thereto.

Figure 14:
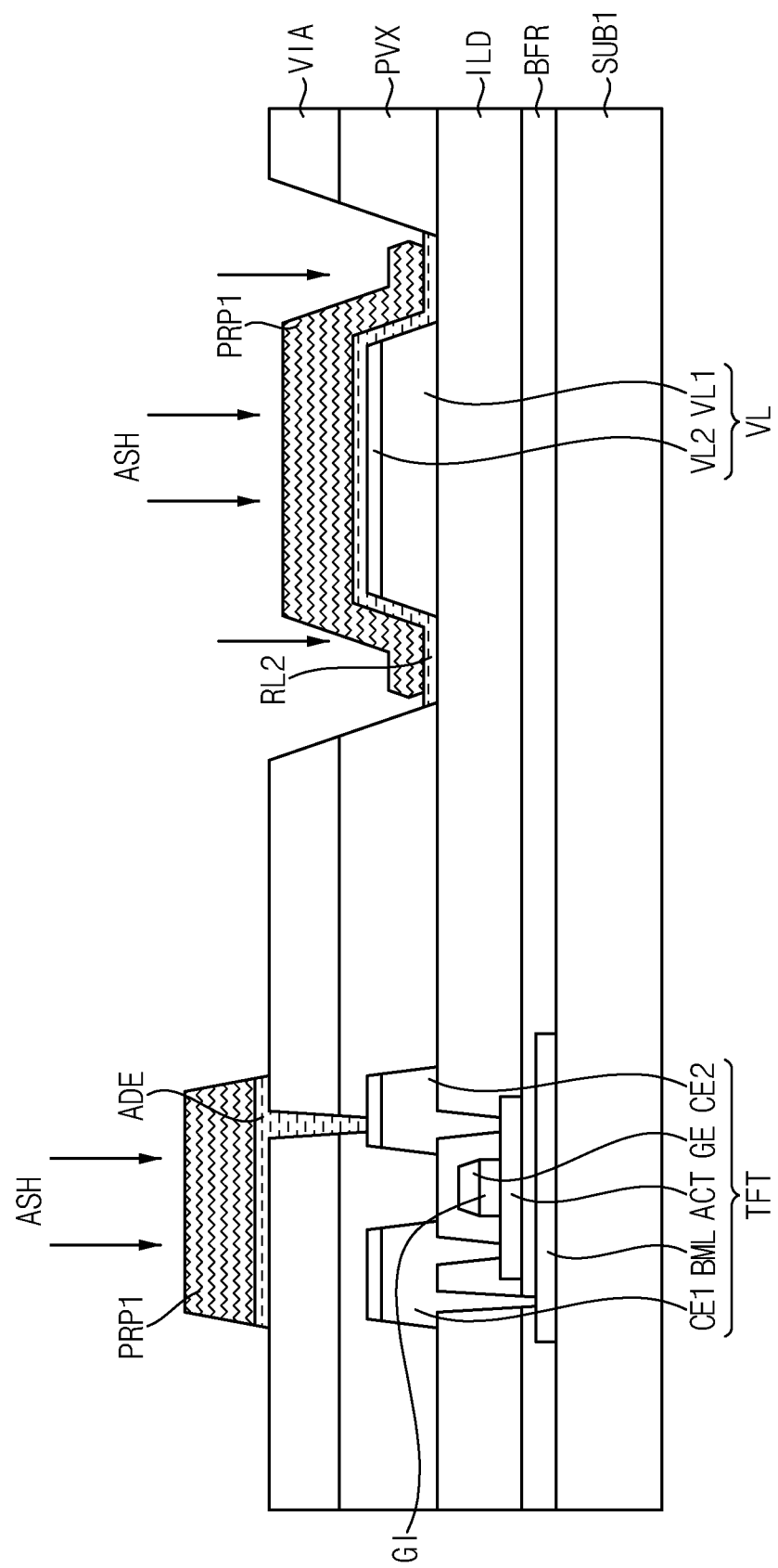
Figure 15:
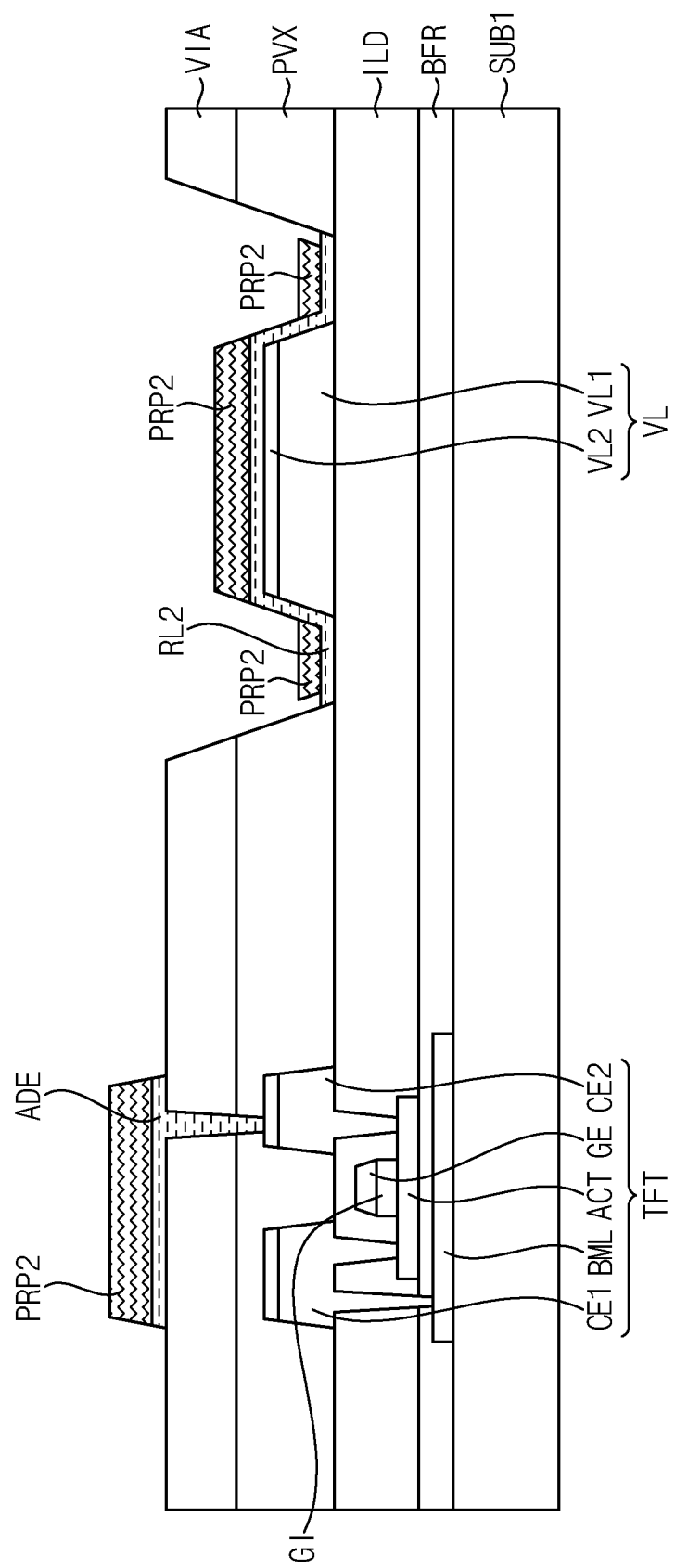

Referring to FIGS. 14 and 15, a second photoresist pattern PRP2 may be formed by ashing the first photoresist pattern PRP1. As shown in FIG. 15, the second photoresist pattern PRP2 may have a shape in which a thickness of the first photoresist pattern PRP1 is reduced by ashing. Accordingly, as shown in FIG. 15, the second photoresist pattern PRP2 may be formed to expose a portion of the second preliminary layer RL2. For example, a portion of a side surface of the second preliminary layer RL2 may be exposed from the second photoresist pattern PRP2.

In an embodiment, the ashing forming the second photoresist pattern PRP2 may be dry ashing, but the present invention is not necessarily limited thereto. In an embodiment, in the process of ashing the first photoresist pattern PRP1, a portion of the via insulation layer VIA may be ashed together with the first photoresist pattern PRP1.

Referring to FIGS. 16 to 19, after the second preliminary layer RL2 exposed by the second photoresist pattern PRP2 is removed, the second photoresist pattern PRP2 may be removed.

Figure 16:
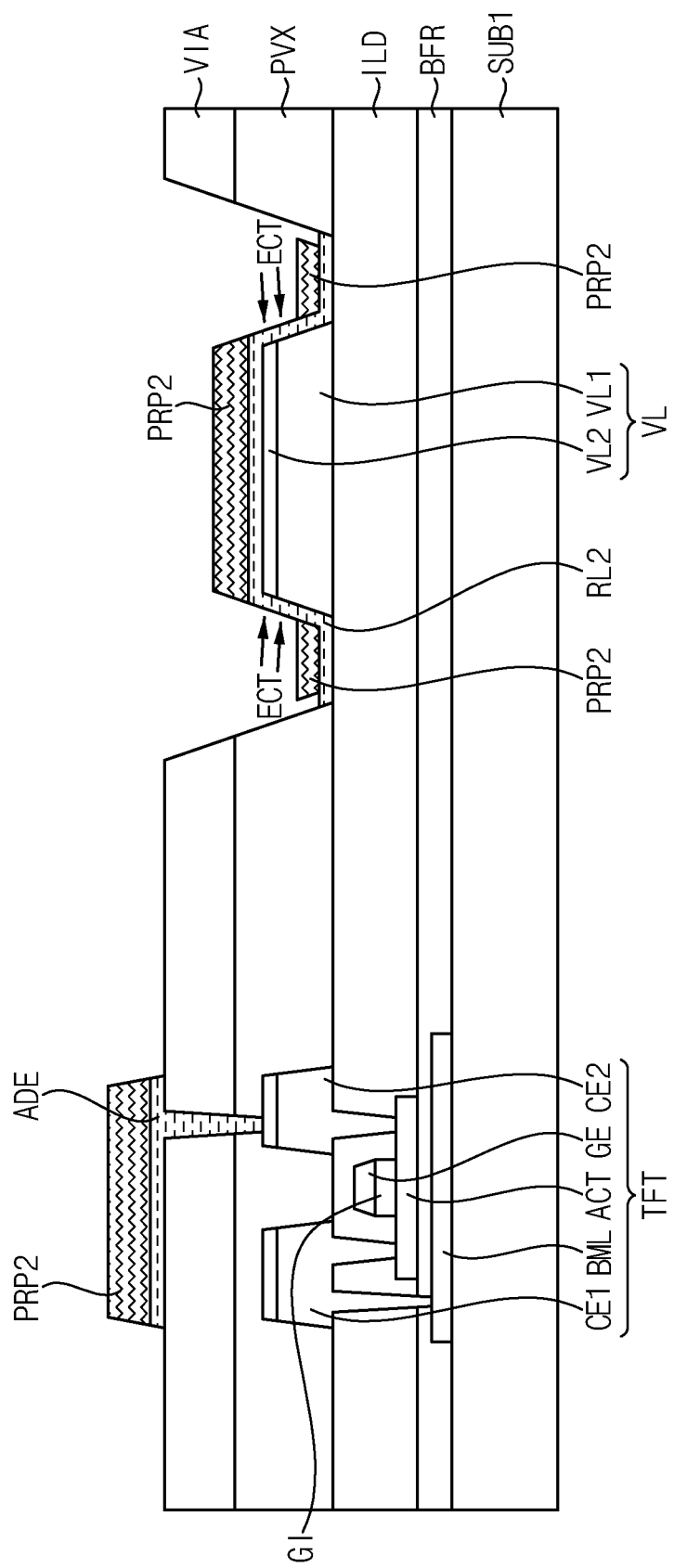
Figure 17:
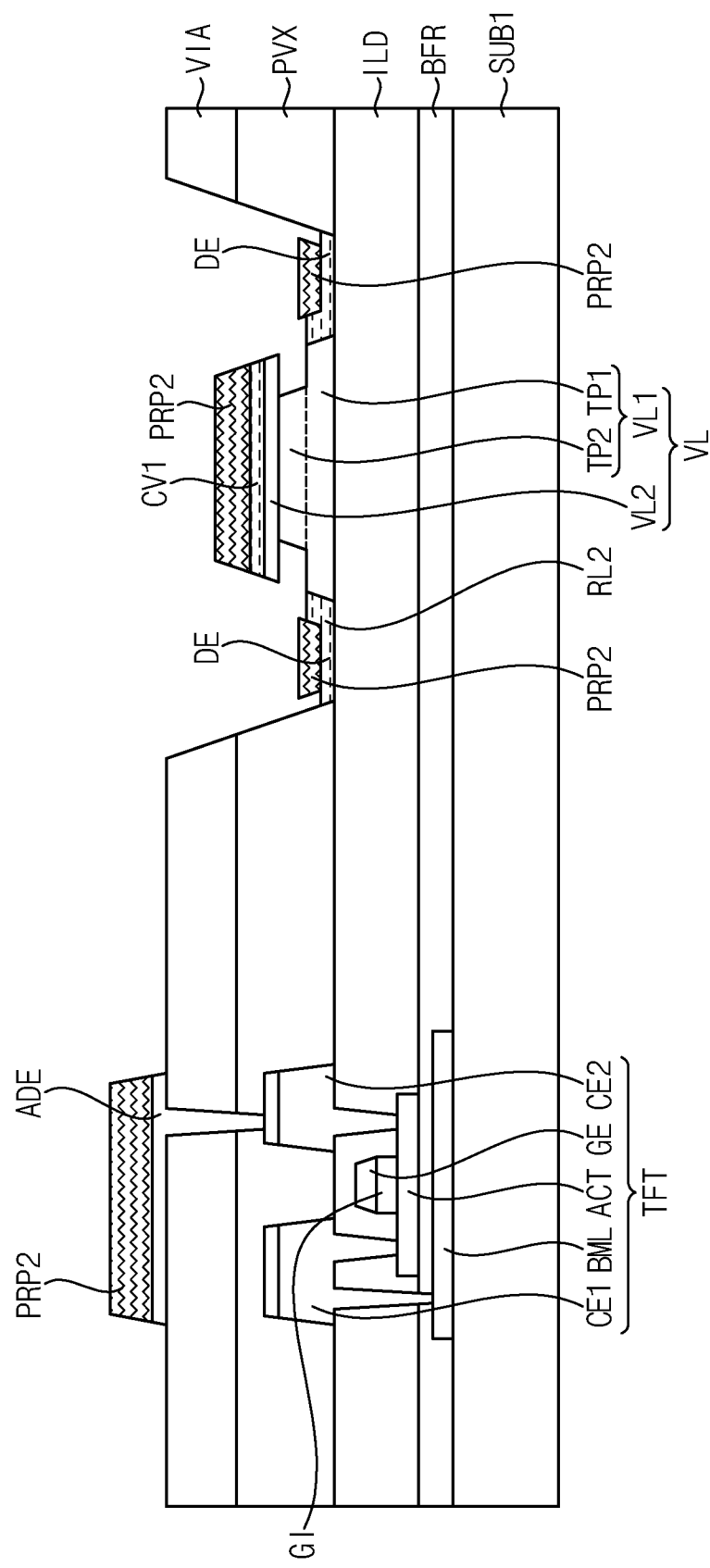

In an embodiment, as shown in FIG. 16, the second preliminary layer RL2 exposed by the second photoresist pattern PRP2 may be removed by an etching process. In other words, the second preliminary layer RL2 may be removed by reacting with an etchant ECT. Accordingly, a portion of the power line VL may be exposed. Specifically, the side surface of the power line VL may be exposed. In an embodiment, the etching process may be a wet etching process.

In an embodiment, an etching rate of the second conductive layer VL2 may be lower than an etching rate of the first conductive layer VL1 in the same etching process. For example, the etching rate of the second conductive layer VL2 with respect to the etchant ECT may be lower than the etching rate of the first conductive layer VL1 with respect to the etchant ECT. Accordingly, in the process of removing the second preliminary layer RL2 by the etchant ECT, a portion of the first conductive layer VL1 of the power line VL may be removed together with the second preliminary layer RL2. For example, a portion of the upper part of the first conductive layer VL1 may be removed by the etchant ECT. On the other hand, in the process of removing the second preliminary layer RL2 by the etchant ECT, the second conductive layer VL2 may not be affected by the etchant ECT.

Accordingly, after the second preliminary layer RL2 exposed by the second photoresist pattern PRP2 is removed, the side surface VL1-S of the first conductive layer VL1 may have a step. Also, the second conductive layer VL2 may have the protrusion part PP spaced apart from the upper surface VL1-U of the first conductive layer VL1. In other words, the second conductive layer VL2 may protrude from the side surface TP2-S of the second tapered part TP2 of the first conductive layer VL1.

In an embodiment, as shown in FIG. 19, the first conductive layer VL1 may include the first tapered part TP1 and the second tapered part TP2 positioned on the first tapered part TP1. In an embodiment, the upper surface TP1-U of the first tapered part TP1 may have a first width, and the lower surface TP2-L of the second tapered part TP2 may have a second width smaller than the first width. In other words, the upper surface TP1-U of the first tapered part TP1 may be exposed from the second tapered part TP2. In this case, the side surface TP1-S of the first tapered part TP1, the upper surface TP1-U of the first tapered part TP1, and the side surface TP2-S of the second tapered part TP2 may constitute the side surface VL1-S of the first conductive layer VL1.

Accordingly, the power line VL may have the depression part DP (or depressed region DP) defined by the upper surface TP1-U of the first tapered part TP1, the side surface TP2-S of the second tapered part TP2, and the lower surface PP-L of the protrusion part PP of the second conductive layer VL2. In other words, the undercut shape may be formed in the power line VL.

In an embodiment, as the second preliminary layer RL2 exposed by the second photoresist pattern PRP2 is removed, the dummy electrodes DE and the first cover part CV1 may be formed. In an embodiment, the dummy electrodes DE may be formed on the interlayer insulating layer ILD. In other words, the dummy electrodes DE may be formed on the same layer as the power line VL.

In an embodiment, each of the dummy electrodes DE may be formed to contact the power line VL. In detail, each of the dummy electrodes DE may be formed to contact the side surface VL1-S of the first conductive layer VL1. For example, each of the dummy electrodes DE may contact the side surface TP1-S of the first tapered part TP1 of the first conductive layer VL1. However, the present invention is not necessarily limited thereto, and in another embodiment, each of the dummy electrodes DE may be spaced apart from the power line VL. Also, some of the dummy electrodes DE may contact the power line VL, and others may be spaced apart from the power line VL.

In an embodiment, the first cover part CV1 may be formed on the second conductive layer VL2. The first cover part CV1 may be disconnected from the dummy electrodes DE by the depression part DP of the power line VL. In other words, the first cover part CV1 may be disconnected from the dummy electrodes DE by the undercut shape of the power line VL. In an embodiment, both the dummy electrodes DE and the first cover part CV1 may be formed of the same material as the pixel electrode ADE.

Figure 20:
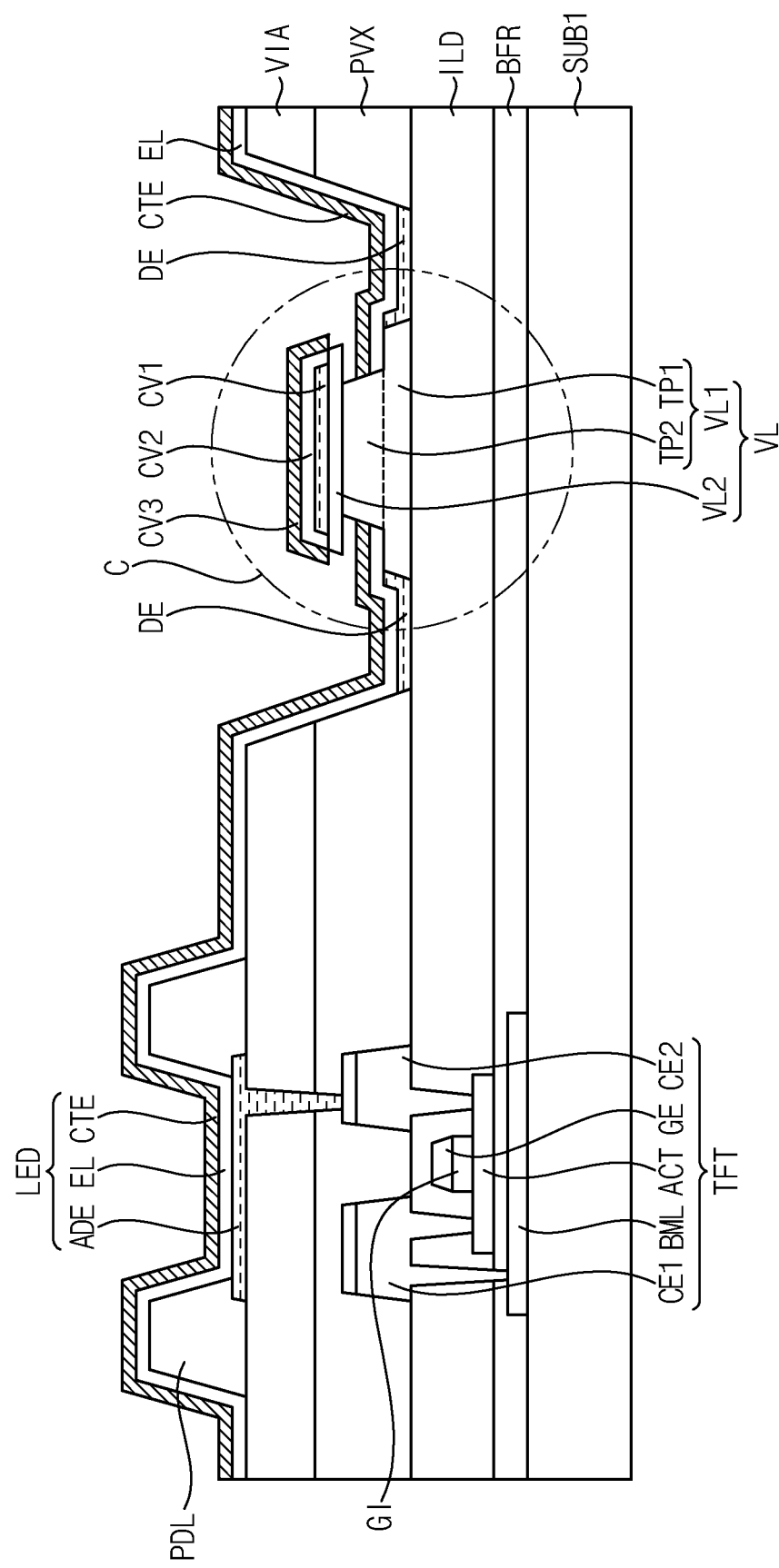
Figure 21:
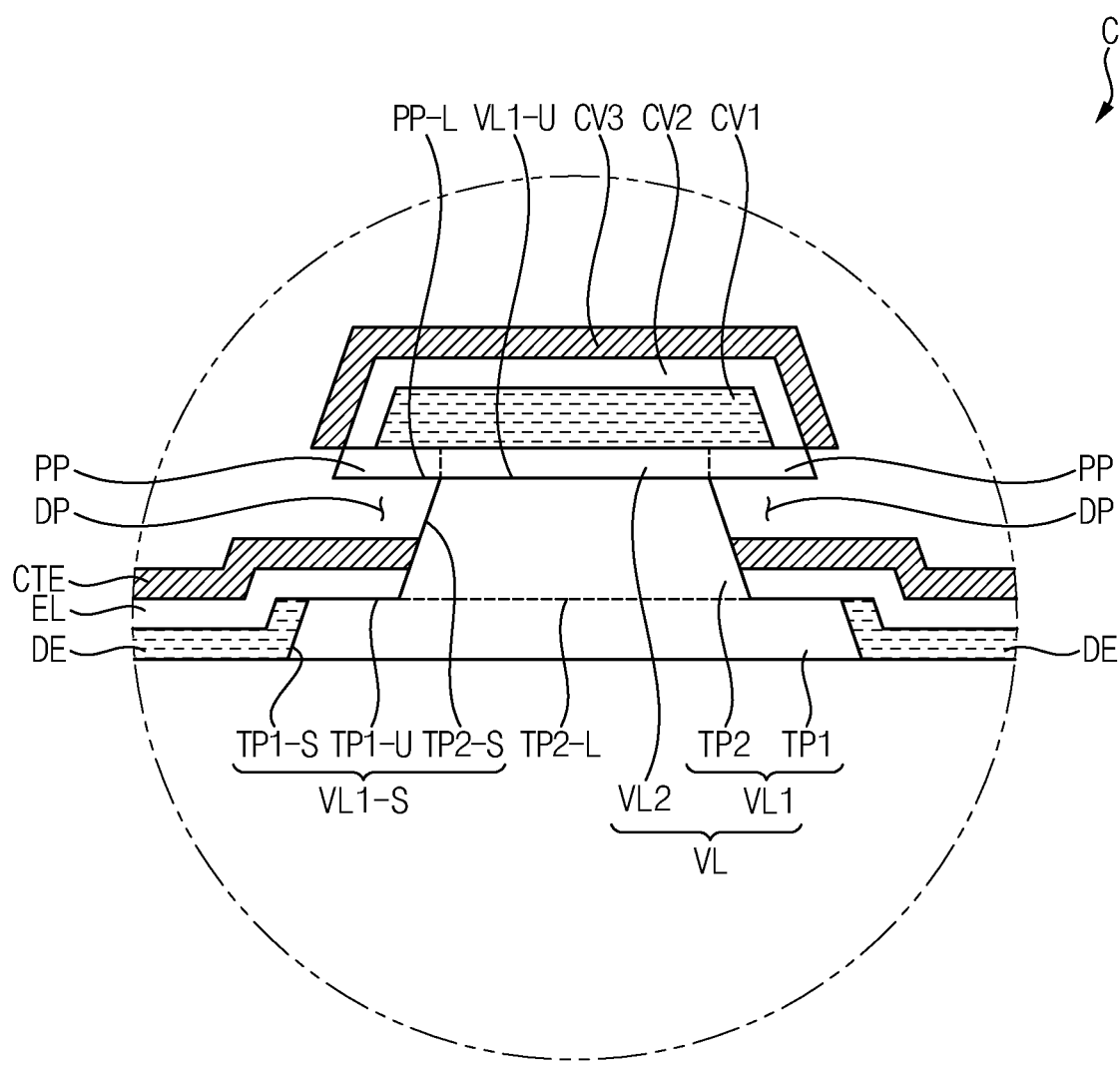

Referring to FIGS. 20 and 21, the pixel defining layer PDL may be formed on the via insulating layer VIA on which the pixel electrode ADE is formed. Thereafter, the emission layer EL, the common electrode CTE, the second cover part CV2 and the third cover part CV3 may be formed on the lower substrate SUB1 on which the pixel defining layer PDL is formed.

In an embodiment, the emission layer EL may be formed on the pixel electrode ADE, the dummy electrodes DE, the pixel defining layer PDL, and the via insulating layer VIA. In an embodiment, the emission layer EL may contact the power line VL. Specifically, the emission layer EL may contact the side surface VL1-S of the first conductive layer VL1. For example, the emission layer EL may contact the side surface VL1-S of the first conductive layer VL1 in the depression part DP of the first conductive layer VL1.

In an embodiment, the second cover part CV2 may be formed on the first cover part CV1. For example, the second cover part CV2 may be formed to cover the first cover part CV1. In an embodiment, the second cover part CV2 may be disconnected from the emission layer EL by the depression part DP of the power line VL. In other words, the second cover part CV2 may be disconnected from the emission layer EL by the undercut shape of the power line VL.

In an embodiment, the emission layer EL and the second cover part CV2 may be formed together. In other words, the emission layer EL and the second cover part CV2 may be formed of the same material.

In an embodiment, the common electrode CTE may be formed on the emission layer EL. In an embodiment, the common electrode CTE may contact the power line VL. Specifically, the common electrode CTE may contact the side surface VL1-S of the first conductive layer VL1. For example, the common electrode CTE may contact the side surface VL1-S of the first conductive layer VL1 in the depression part DP of the first conductive layer VL1. Accordingly, the common electrode CTE may be electrically connected to the power line VL.

In an embodiment, the third cover part CV3 may be formed on the second cover part CV2. For example, the third cover part CV3 may be formed to cover the second cover part CV2. In an embodiment, the third cover part CV3 may be disconnected from the common electrode CTE by the depression part DP of the power line VL. In other words, the third cover part CV3 may be disconnected from the common electrode CTE by the undercut shape of the power line VL.

In an embodiment, the common electrode CTE and the third cover part CV3 may be formed together. In other words, the common electrode CTE and the third cover part CV3 may be formed of the same material.

Figure 22:
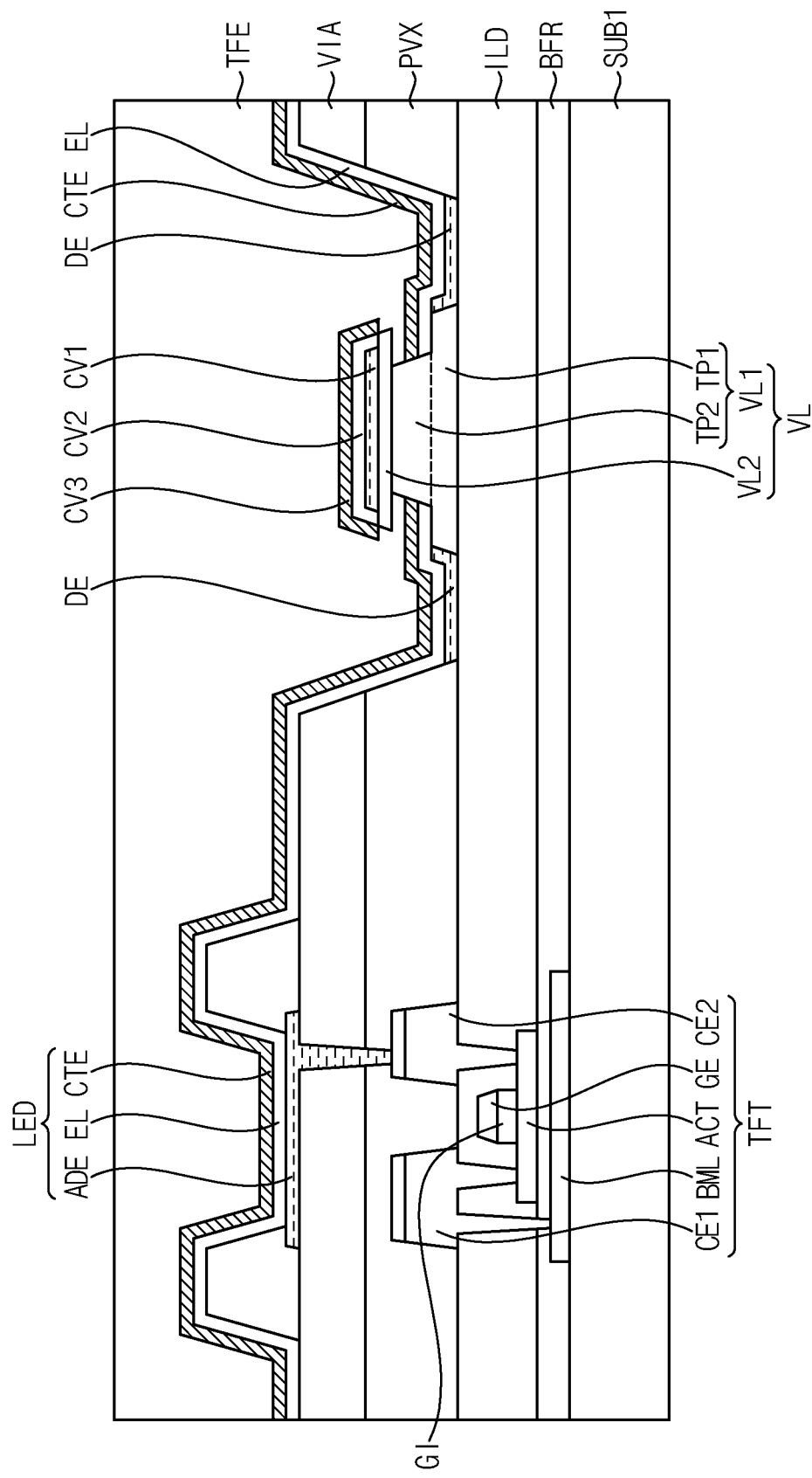

Referring to FIG. 22, the thin film encapsulation layer TFE may be formed on the common electrode CTE and the third cover part CV3. In an embodiment, the thin film encapsulation layer TFE may include at least one organic encapsulation layer and at least one inorganic encapsulation layer.

According to embodiments, the display device DD may include the power line VL and the common electrode CTE, the power line VL may have the depression part DP, and the common electrode CTE may contact the power line VL in the depression part DP. In this case, the depression part DP of the power line VL may be formed through an ashing and etching process using a photoresist without a separate laser drilling process. Accordingly, an efficiency of the manufacturing process of the display device DD may be improved.

Figure 23:
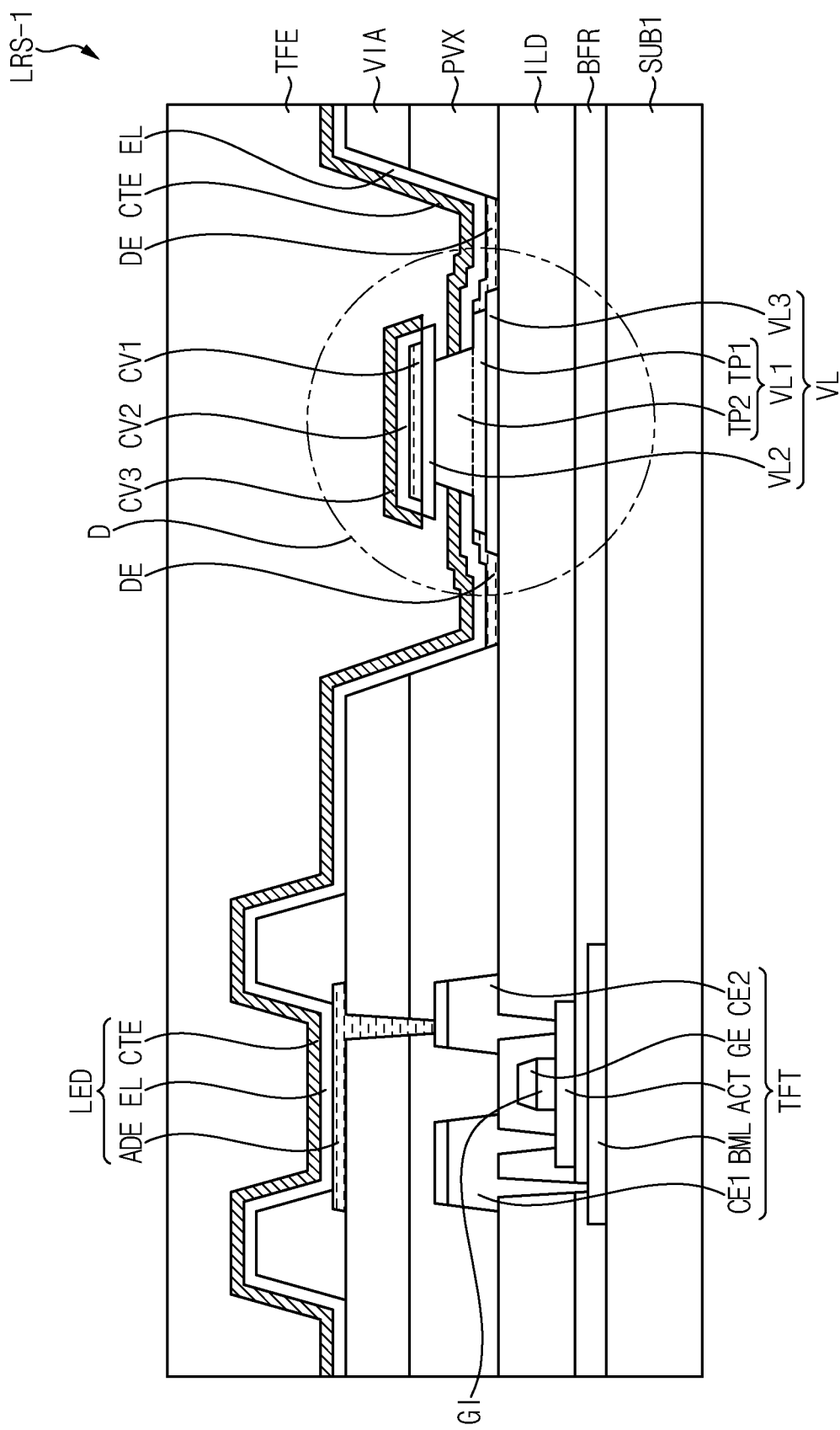
FIGS. 23 and 24 are views illustrating a lower structure according to another embodiment.
Figure 24:
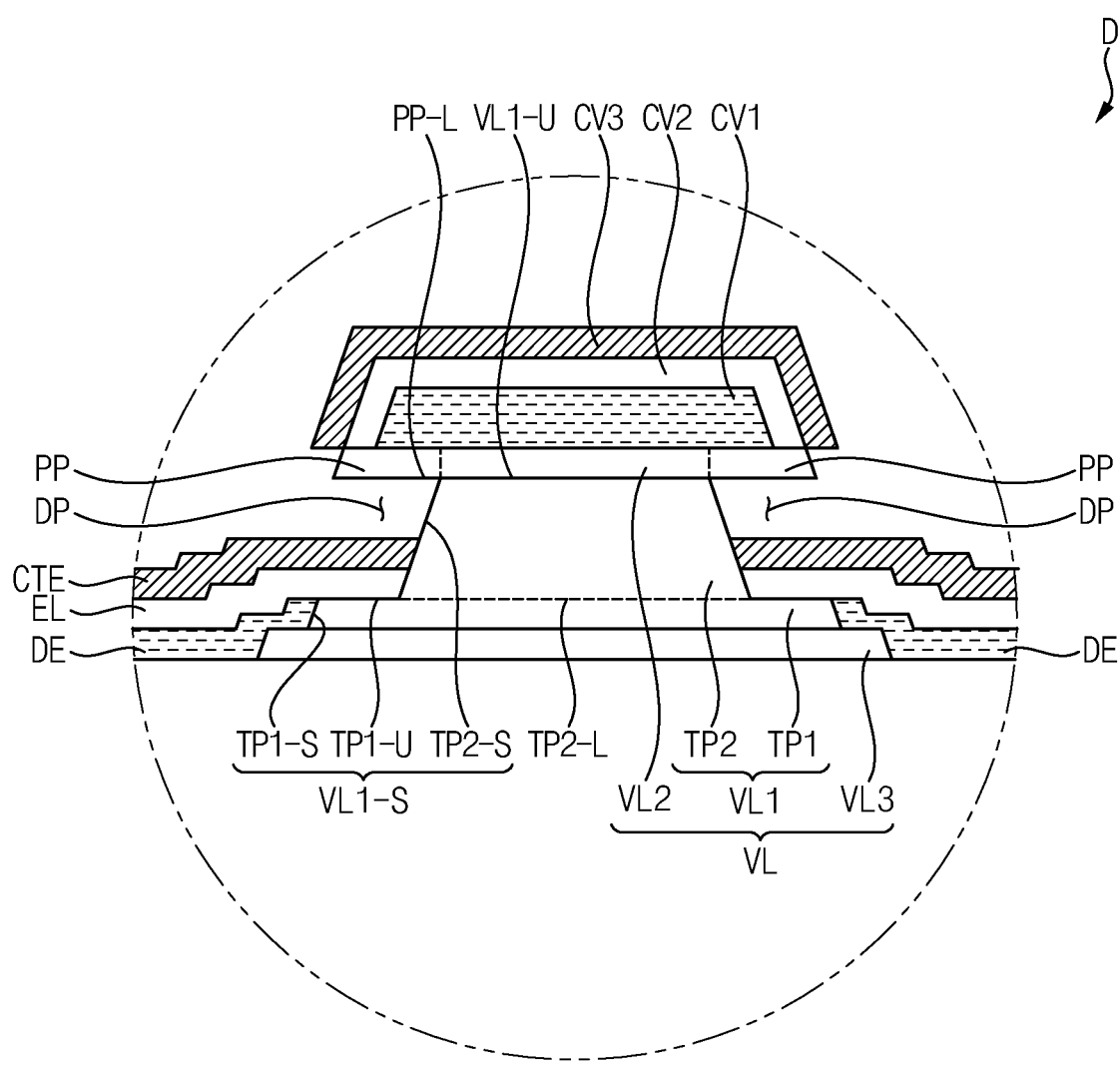

FIGS. 23 and 24 are views illustrating a lower structure according to another embodiment. For example, FIG. 23 may correspond to the cross-sectional view of FIG. 5 and FIG. 24 may be an enlarged view of area 'D' of FIG. 23.

Referring to FIGS. 23 and 24, a lower structure LRS-1 may be substantially the same as the lower structure LRS described above with reference to FIG. 5 except for the third conductive layer VL3.

In an embodiment, the power line VL may further include the third conductive layer VL3. The third conductive layer VL3 may be disposed under the first conductive layer VL1. In an embodiment, the third conductive layer VL3 may have a tapered shape. In other words, the upper surface of the third conductive layer VL3 may have a narrower width than the lower surface of the third conductive layer VL3.

In an embodiment, the third conductive layer VL3 may include a material different from that of the first conductive layer VL1 and the second conductive layer VL2. For example, the first conductive layer VL1 may include copper (Cu), the second conductive layer VL2 may include indium tin oxide (ITO), and the third conductive layer VL3 may include titanium (Ti). However, the present invention is not necessarily limited thereto, and in another embodiment, the second conductive layer VL2 and the third conductive layer VL3 are formed of the same material, and the first conductive layer VL1 may be formed of a material different from that of the second conductive layer VL2 and the third conductive layer VL3. For example, the first conductive layer VL1 may include copper (Cu), and the second conductive layer VL2 and the third conductive layer VL3 may include indium tin oxide (ITO). Also, the first conductive layer VL1 may include copper (Cu), and the second conductive layer VL2 and the third conductive layer VL3 may include titanium (Ti).

Figure 25:
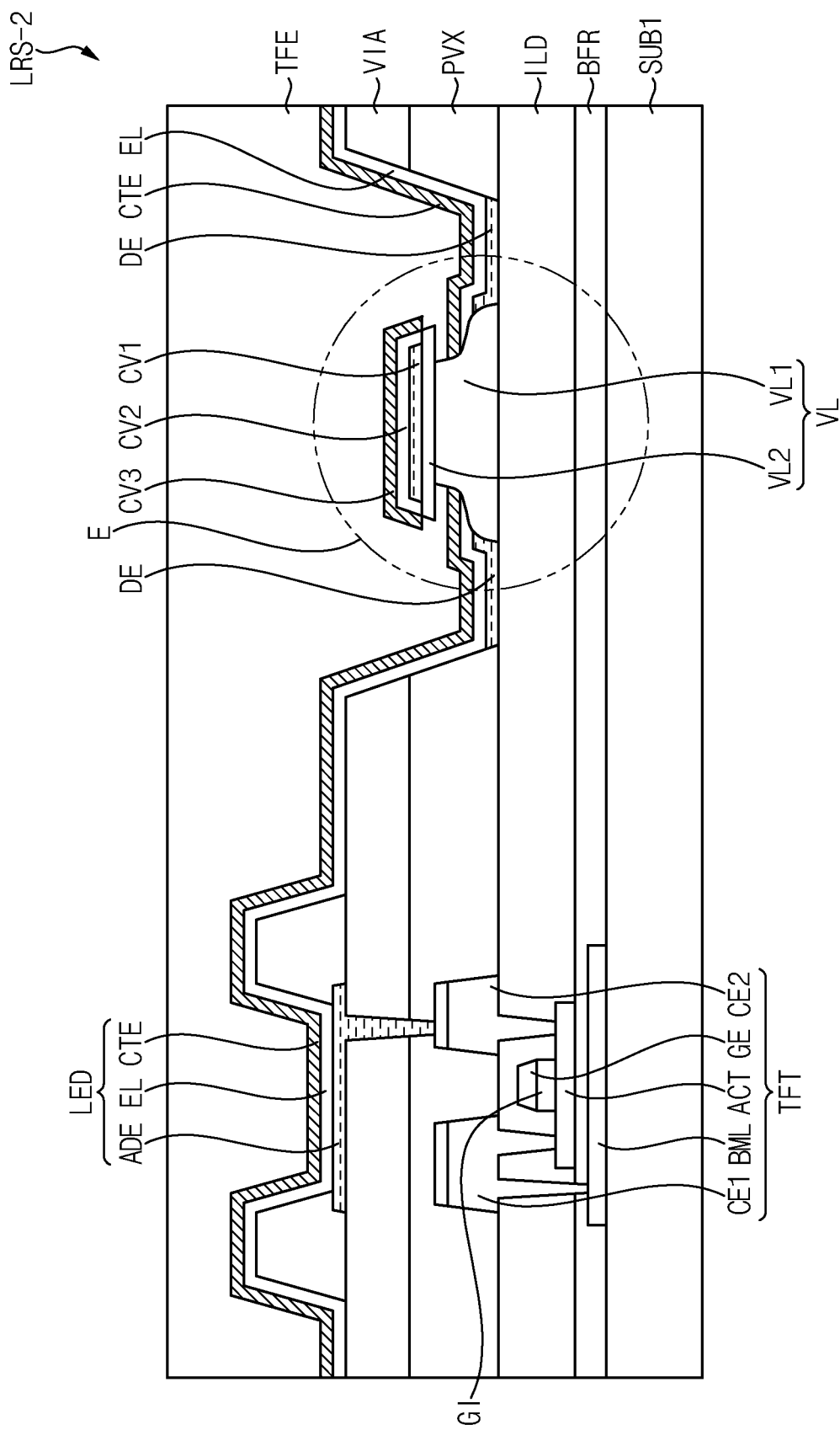
FIGS. 25 and 26 are views illustrating a lower structure according to still another embodiment.
Figure 26:
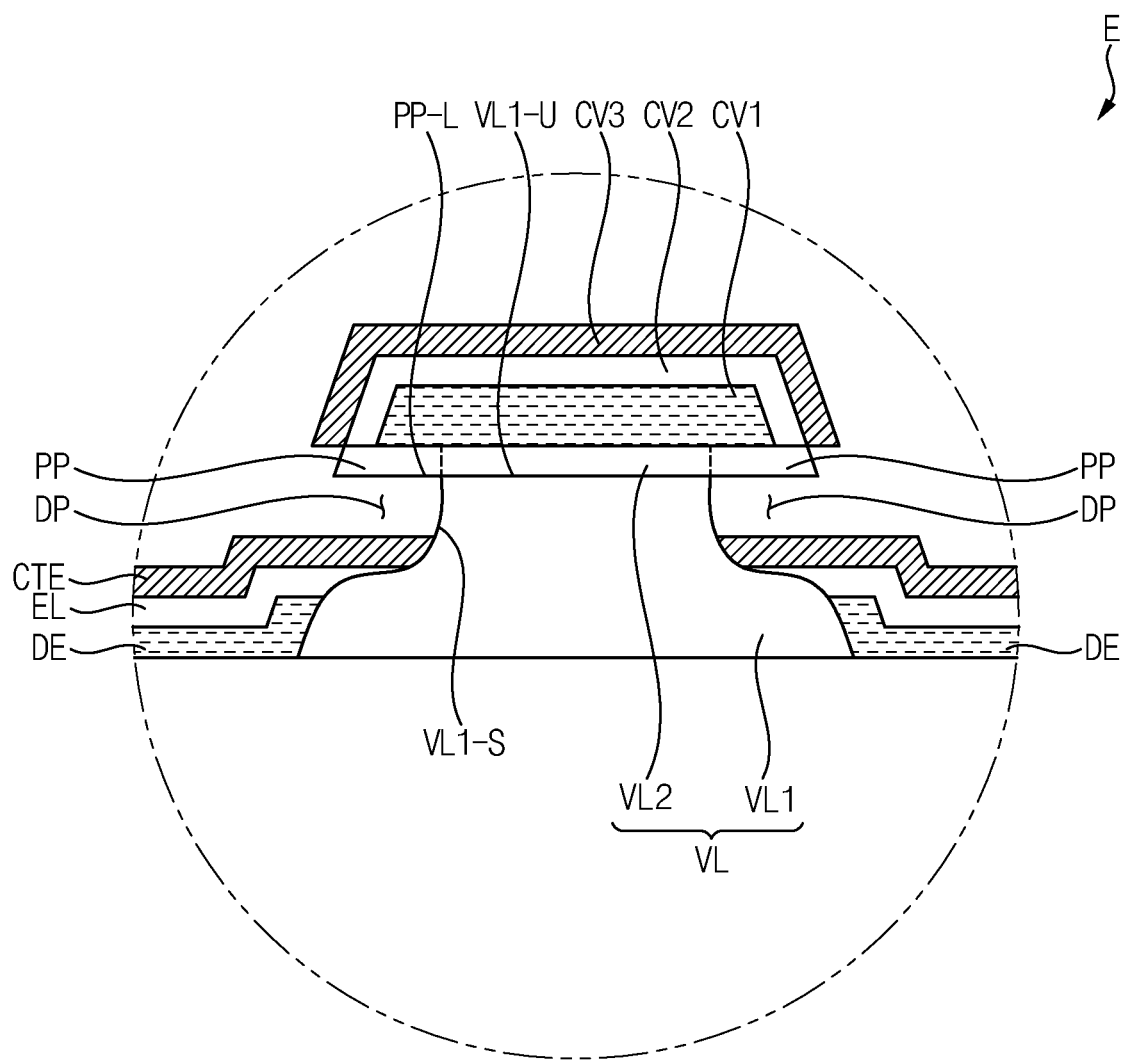

FIGS. 25 and 26 are views illustrating a lower structure according to still another embodiment. For example, FIG. 25 may correspond to the cross-sectional view of FIG. 5 and FIG. 26 may be an enlarged view of area 'E' of FIG. 25.

Referring to FIGS. 25 and 26, a lower structure LRS-2 may be substantially the same as the lower structure LRS described above with reference to FIG. 5 except for a shape of the side surface VL1-S of the first conductive layer VL1 of the power supply line VL.

In an embodiment, the side surface VL1-S of the first conductive layer VL1 may have a curved shape. In other words, the side surfaces VL1-S of the first conductive layer VL1 may be continuously connected without a separate step. However, even in this case, the first conductive layer VL1 may have a wider width from the second conductive layer VL2 toward the interlayer insulating layer ILD.

In this case, the depression part DP may be defined by the side surface VL1-S of the first conductive layer VL1 and the lower surface PP-L of the protrusion part PP of the second conductive layer VL2 and the common electrode CTE may contact the side surface VL1-S of the first conductive layer VL1 in the depression part DP.

According to embodiments, the display device may include the power line VL and the common electrode CTE, the power line VL may have the depression part DP, and the common electrode CTE may contact the power line VL in the depression part DP. Accordingly, a drop in voltage provided to the common electrode CTE may be prevented.

In addition, the depression part DP of the power line VL may be formed through an ashing and etching process using a photoresist without a separate laser drilling process. Accordingly, an efficiency of the manufacturing process of the display device may be improved.

While the present disclosure has been described with reference to embodiments thereof, it will be apparent to those of ordinary skill in the art that various changes and modifications may be made thereto without departing from the scope and spirit of the present disclosure as set forth in the following claims.

What is claimed is:

1. A display device comprising:
    a substrate;
    a thin film transistor disposed on the substrate;
    a power line disposed on the substrate and including a first conductive layer and a second conductive layer having a protrusion part spaced apart from an upper surface of the first conductive layer;
    a pixel electrode disposed on the substrate and electrically connected to the thin film transistor;
    an emission layer disposed on the pixel electrode;
    a common electrode disposed on the emission layer and contacting the power line; and
    dummy electrodes disposed on the same layer as the power line and including the same material as the pixel electrode.

2. The display device of claim 1, wherein a side surface of the first conductive layer has a step.

3. The display device of claim 2, wherein the first conductive layer includes:
    a first tapered part having a tapered shape and having an upper surface of a first width; and
    a second tapered part positioned on the first tapered part, having a tapered shape, and having a lower surface of a second width smaller than the first width.

4. The display device of claim 3, wherein the power line has a depression part defined by the upper surface of the first tapered part, a side surface of the second tapered part, and a lower surface of the protrusion part of the second conductive layer, and
    wherein the common electrode contacts the side surface of the first conductive layer in the depression part.

5. The display device of claim 1, wherein a side surface of the first conductive layer has a curved shape.

6. The display device of claim 5, wherein the power line has a depression part defined by the side surface of the first conductive layer and a lower surface of the protrusion part of the second conductive layer, and
    wherein the common electrode contacts the side surface of the first conductive layer in the depression part.

7. The display device of claim 1, wherein a width of a lower surface of the protrusion part is about 0.1 micrometers to about 1.0 micrometers.

8. The display device of claim 1, wherein each of the dummy electrodes contacts the power line.

9. The display device of claim 1, further comprising:
    a first cover part disposed on the second conductive layer and including the same material as the pixel electrode and the dummy electrodes;
    a second cover part disposed on the first cover part and including the same material as the emission layer; and
    a third cover part disposed on the second cover part and including the same material as the common electrode.

10. The display device of claim 1, wherein the emission layer contacts the power line.

11. The display device of claim 1, further comprising:
    a third conductive layer disposed below the first conductive layer.

12. A method of manufacturing a display device, the method comprising:
    forming a power line including a first conductive layer and a second conductive layer disposed on the first conductive layer and a thin film transistor on a substrate;

forming a plurality of insulating layers defining an opening exposing the power line on the substrate;

forming a first preliminary layer covering the plurality of insulating layers and the power line;

forming a first photoresist pattern exposing a portion of the first preliminary layer by coating a photoresist film on the first preliminary layer and exposing the photoresist film using an exposure mask;

removing the portion of the first preliminary layer exposed by the first photoresist pattern to form a pixel electrode electrically connected to the thin film transistor and a second preliminary layer covering the power line;

ashing the first photoresist pattern to form a second photoresist pattern exposing a portion of the second preliminary layer;

removing the portion of the second preliminary layer exposed by the second photoresist pattern to form dummy electrodes disposed on the same layer as the power line and including the same material as the pixel electrode and expose a portion of the power line;

removing the second photoresist pattern;

forming an emission layer disposed on the pixel electrode; and forming a common electrode disposed on the emission layer and contacting the power line.

13. The method of claim 12, wherein the exposure mask includes:
a light blocking part which blocks light;
a first light transmitting part having a first light transmittance; and
a second light transmitting part having a second light transmittance lower than the first light transmittance.

14. The method of claim 12, wherein the portion of the second preliminary layer exposed by the second photoresist pattern is removed by an etching process using an etchant,
an etching rate of the second conductive layer using the etchant is lower than an etching rate of the first conductive layer using the etchant.

15. The method of claim 14, wherein in the step of removing the portion of the second preliminary layer exposed by the second photoresist pattern,
a portion of the first conductive layer is removed together with the portion of the second preliminary layer.

16. The method of claim 15, wherein after removing the portion of the second preliminary layer exposed by the second photoresist pattern,
a side surface of the first conductive layer has a step.

17. The method of claim 16, wherein after removing the portion of the second preliminary layer exposed by the second photoresist pattern,
the first conductive layer includes:
a first tapered part having a tapered shape and having an upper surface of a first width; and
a second tapered part positioned on the first tapered part, having a tapered shape, and having a lower surface of a second width smaller than the first width.

18. The method of claim 15, wherein after removing the portion of the second preliminary layer exposed by the second photoresist pattern,
a side surface of the first conductive layer has a curved shape.

19. The method of claim 12, wherein in the step of removing the portion of the second preliminary layer exposed by the second photoresist pattern,
a first cover part including the same material as the dummy electrodes is formed on the second conductive layer.

20. The method of claim 19, wherein in the step of forming the emission layer,
a second cover part including the same material as the emission layer is formed on the first cover part, and
wherein in the step of forming of the common electrode,
a third cover part including the same material as the common electrode is formed on the second cover part.

* * * * *